United States Patent [19]

Sasaki et al.

[11] Patent Number: 4,520,283
[45] Date of Patent: May 28, 1985

[54] BAND PASS FILTER WITH A SWITCHED CAPACITOR

[76] Inventors: Itsuo Sasaki, c/o Katsunuma, 1315 Kamihirama, Nakahara-ku, Kawasaki-shi; Hiroaki Suzuki, 2-11-1-514, Kaminagaya, Konan-ku, Yokohama-shi, both of Japan

[21] Appl. No.: 394,874

[22] Filed: Jul. 2, 1982

[30] Foreign Application Priority Data

Sep. 1, 1981 [JP] Japan ................... 56-137235
Sep. 1, 1981 [JP] Japan ................... 56-137236
Sep. 1, 1981 [JP] Japan ................... 56-137237

[51] Int. Cl.³ .................. H03H 11/12; H03K 17/693
[52] U.S. Cl. ............................. 307/520; 307/296 R; 307/491; 307/510; 307/246; 328/151; 333/173
[58] Field of Search ............. 307/490, 491, 497, 501, 307/510, 520, 521–522, 524, 529, 354, 543, 556, 583, 246, 228, 297, 296 R; 328/151, 167; 333/173

[56] References Cited

U.S. PATENT DOCUMENTS

| | | | |
|---|---|---|---|
| 3,814,957 | 6/1974 | Way ........................... | 307/362 X |
| 4,260,946 | 4/1981 | Wheatley, Jr. ............. | 307/297 X |
| 4,313,096 | 1/1982 | Fleischer .................... | 328/151 X |
| 4,315,227 | 2/1982 | Fleischer .................... | 328/151 |
| 4,333,064 | 6/1982 | Kato et al. ................. | 333/173 |
| 4,378,538 | 3/1983 | Gignoux .................... | 328/151 X |

OTHER PUBLICATIONS

Davis, "Switched-Capacitor Techniques Implement Effective IC Filters," EDN, Nov. 5, 1979, at 103–108.
Brodersen et al., "MOS Switched-Capacitor Filters", 67 IEEE Proc. 61–75 (Jan. 1979).
Bosshart, "A Multiplexed Switched Capacitor Filter Bank", IEEE JSSC, vol. SC-15, No. 6, Dec. 1980, pp. 939–945 (333/173).
Gregorian, "Filtering Techniques With Switched-Capacitor Circuits", Microelectronics Journal, vol. 11, No. 2, Mackintosh Pubs. Ltd., 4–1980, 13–21.
Pierce, Transistor Circuit Theory and Design, Charles E. Merrill Books, Inc., 1953, pp. 192, 212.

*Primary Examiner*—Stanley D. Miller
*Assistant Examiner*—David R. Hudspeth

[57] ABSTRACT

A switched capacitor circuit has: first and second power sources; an operational amplifier driven by the power sources; a feedback capacitor connected to the inverting input terminal and the output terminal of the amplifier; a switched capacitor connected between a signal input terminal which receives an input signal voltage and the inverting input terminal of the amplifier; switching circuits for controlling the charging and discharging operations of the switched capacitor; and a bias circuit which is connected between the power sources and which applies a predetermined voltage to the non-inverting input terminal of the amplifier.

6 Claims, 43 Drawing Figures

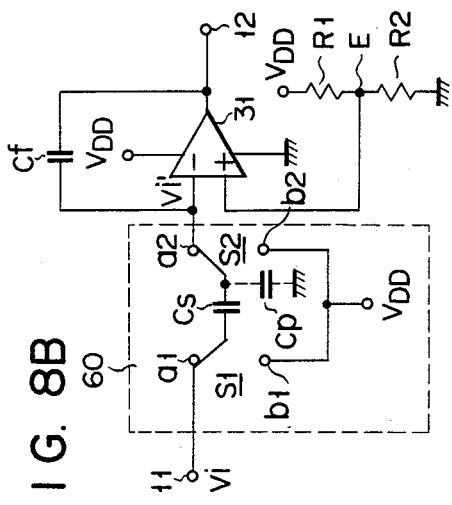
F I G. 8B
F I G. 9B
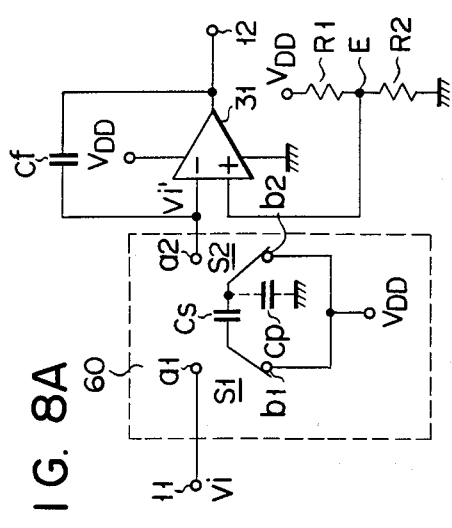
F I G. 8A
F I G. 9A

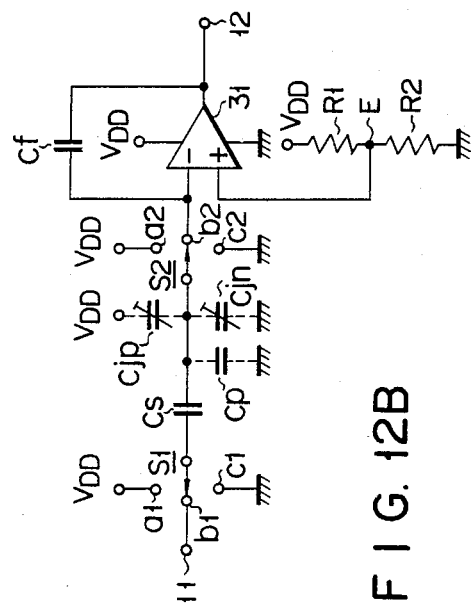
F I G. 12B
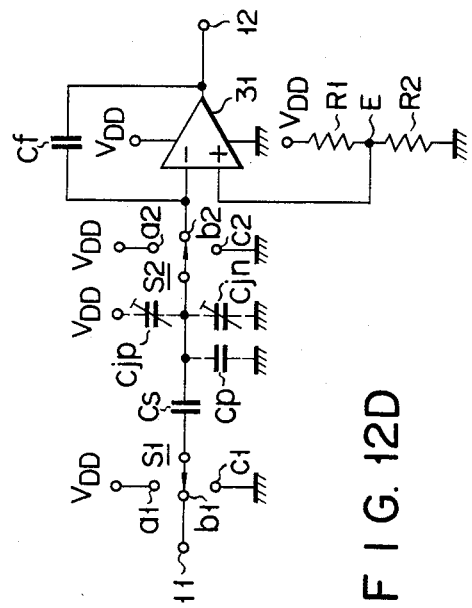
F I G. 12D
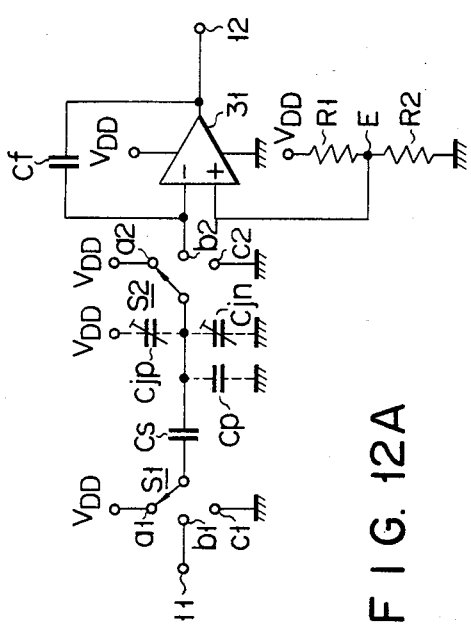
F I G. 12A
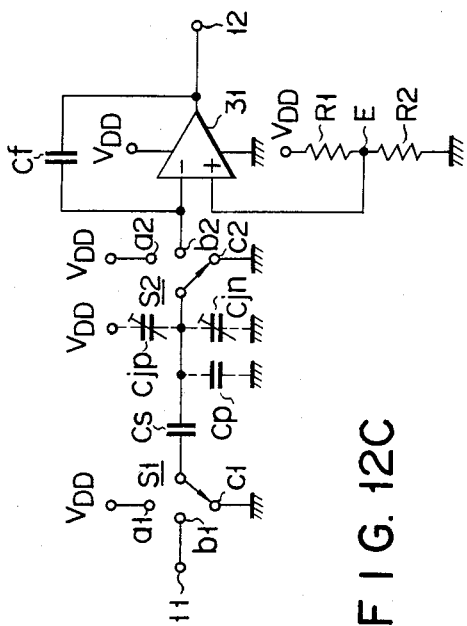
F I G. 12C F I G. 13A
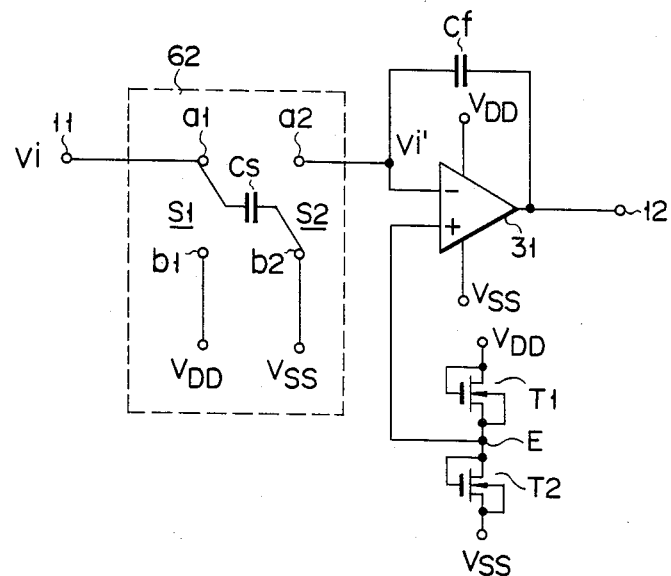
F I G. 13B
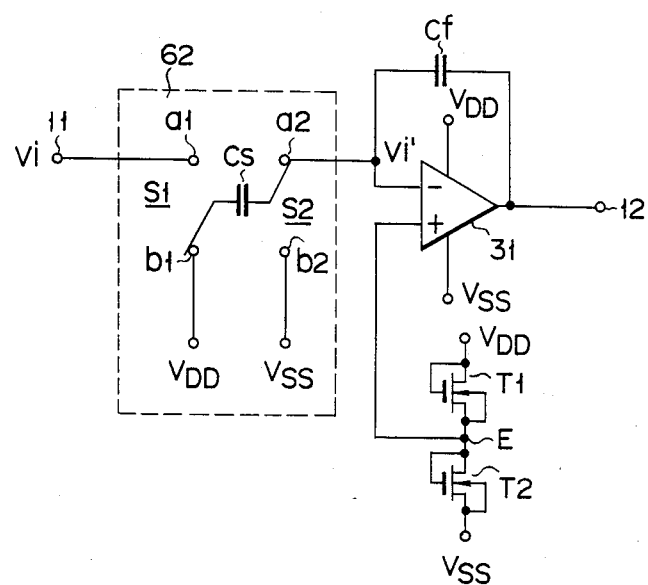

F I G. 17A
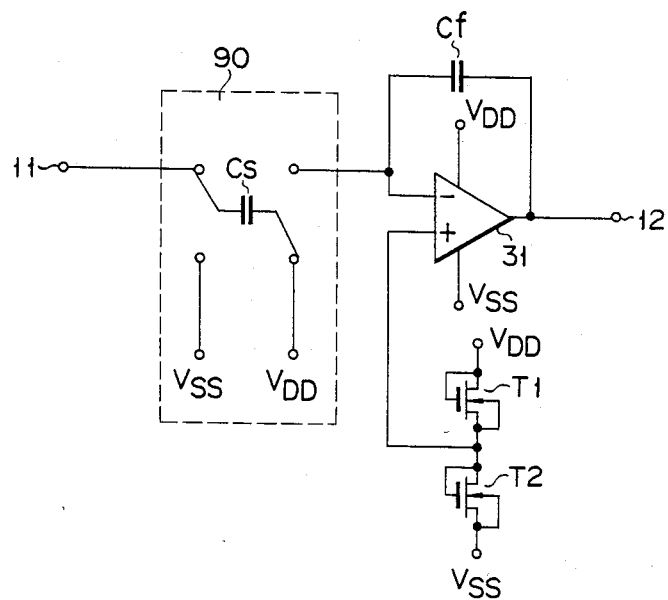
F I G. 17B
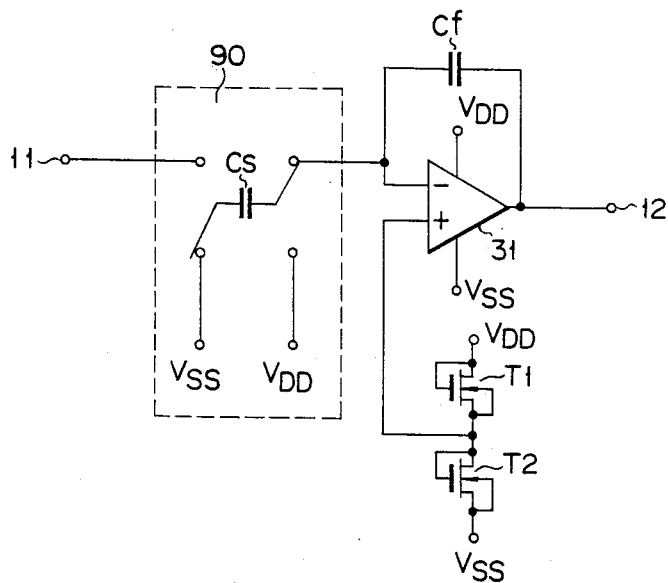

F I G. 19A
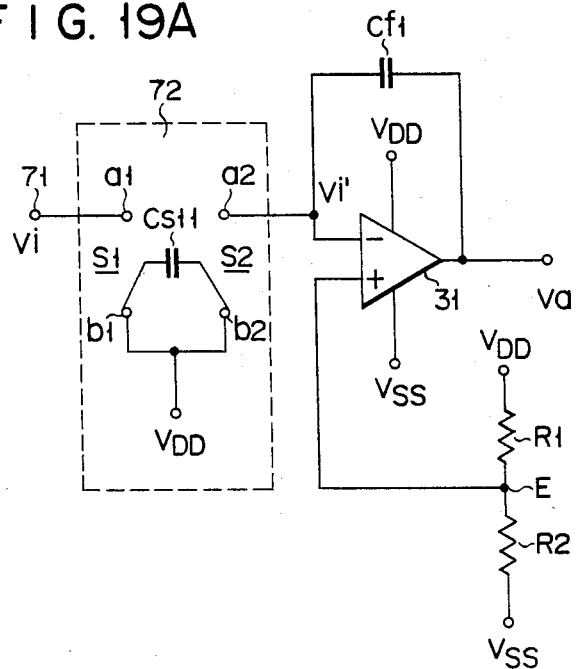
F I G. 19B
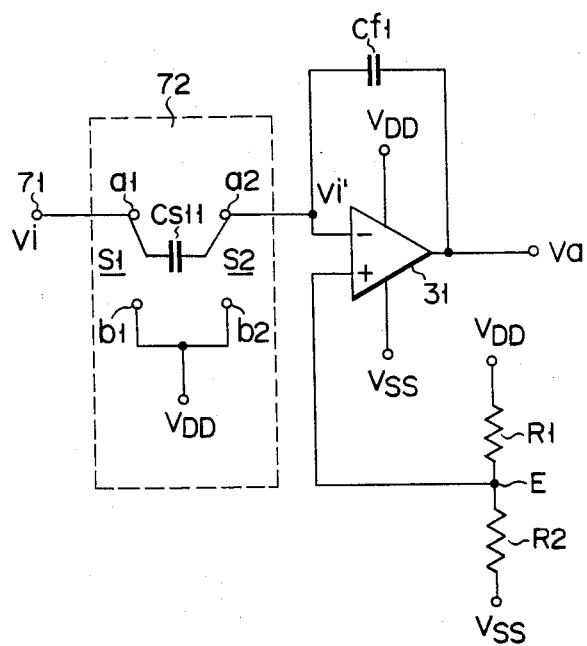

BAND PASS FILTER WITH A SWITCHED CAPACITOR

BACKGROUND OF THE INVENTION

The present invention relates to a switched capacitor device for use in an electronic filter, voice recognition circuit or voice synthesizing circuit.

FIGS. 1A and 1B are circuit diagrams showing the basic circuit configuration of a switched capacitor circuit, while FIG. 2 shows an equivalent circuit thereof. In the circuit shown in FIGS. 1A and 1B, a first stationary contact "a" of a switch S is connected to an input terminal 11, and a second stationary contact "b" is connected to an output terminal 12. A common contact "c" is grounded through a switched capacitor Cs. The input and output terminals 11 and 12 are kept at potentials corresponding to input and output voltage signals Vi and Vo, respectively, with reference to ground. Referring to FIG. 1A, when the switch S is connected to the side of the contact "a" to be connected to the input terminal 11, charge Q1 charged on the capacitor Cs is given by $Q1 = Cs \cdot Vi$. On the other hand, when the switch S is connected to the side of the contact "b" to be connected to the output terminal 12 as in FIG. 1B, charge Q2 stored on the capacitor Cs is given by $Q2 = Cs \cdot Vo$. This means that charge $\Delta Q$ (total amount of charge transfer) is transferred from the input terminal 11 to the output terminal 12 when the switch S is switched from the input terminal 11 to the output terminal 12. Charge $\Delta Q$ is given by:

$$\Delta Q = Q1 - Q2 = Cs(Vi - Vo) \quad (1)$$

If the switch S is switched at a switching frequency (per second) of fs, an average current i flowing from the input terminal 11 to the output terminal 12 is given by:

$$I = \Delta Q \cdot fs = Cs(Vi - Vo)fs \quad (2)$$

If the switching frequency fs of the switch S is sufficiently greater than the frequencies of the voltages Vi and Vo, the average current i becomes equal to a current which is determined by the instantaneous values of the voltages Vi and Vo. Therefore, the circuit shown in FIGS. 1A and 1B becomes equivalent to a circuit shown in FIG. 2 wherein an equivalent resistor R is connected between the input terminal 11 and the output terminal 12 where R is given by:

$$R = (Vi - Vo)/i = 1/(Cs \cdot fs) \quad (3)$$

A switched capacitor circuit is thus provided wherein one end of a switched capacitor Cs whose other end is connected to a reference potential (ground) is switched between two different potentials such that an equivalent resistor R is connected between these two different potentials.

FIG. 3 shows a circuit diagram of a mirror integrator having an operational amplifier 31. The input-output characteristic of the integrator is given by:

$$Vo/Vi = 1/(S \cdot Rs \cdot Cf) \quad (4)$$

where
Vi is the input voltage signal;
Vo is the output voltage signal;
Rs is the resistance of an input resistor connected between the input terminal 11 and the inverting input terminal (−) of the operational amplifier 31;
Cf is the capacitance of a feedback capacitor connected between the output terminal of the operational amplifier 31 and the inverting input terminal (−) thereof; and
S is the Laplacian.

Referring to FIG. 3, reference symbols VDD and VSS denote power sources, and the non-inverting input terminal (+) of the operational amplifier 31 is grounded.

FIG. 4 is a circuit diagram of a mirror integrator which has a switched capacitor circuit 41 in place of the input resistor Rs in the circuit shown in FIG. 3. The input-output characteristic of the mirror integrator is yielded by substitution of R in equation (3) with Rs in equation (4) as follows:

$$Vo/Vi = fs/\{S(Cf/Cs)\} \quad (5)$$

It is seen from equation (5) above that the input-output characteristic of the mirror integrator shown in FIG. 4 is determined by a function, more specifically, a linear function of the capacitance ratio of the capacitors Cs and Cf and the switching frequency fs of the switch S. This means that an integration constant can be varied in proportion to the switching frequency fs. Therefore, a filter including the mirror integrator shown in FIG. 4 can switch the filtering frequency in proportion to the switching frequency fs.

FIGS. 5A and 5B, and 6A and 6B respectively show mirror integrators equivalent to the mirror integrator shown in FIG. 4. In the mirror integrators shown in FIGS. 5A and 5B, and 6A and 6B, switched capacitor circuits 50 and 51 respectively have two switches S1 and S2 which switch both ends of the capacitor Cs simultaneously. A first stationary contact "a1" of the switch S1 is connected to the input terminal 11, a second stationary contact "b1" is grounded, and the common contact is connected to one end of the capacitor Cs. A first stationary contact "a2" of the switch S2 is connected to the inverting input terminal (−) of the operational amplifier 31, a second stationary contact "b2" is grounded, and the common contact is connected to the other end of the capacitor Cs.

In the mirror integrator shown in FIGS. 5A and 5B, the switched capacitor circuit is used as a resistor having a positive resistance.

When the switches S1 and S2 are connected to the sides of the second stationary contacts "b1" and "b2" as shown in FIG. 5A, charge on the capacitor Cs is discharged and is therefore zero. When the switches S1 and S2 are switched to the sides of the first stationary contacts "a1" and "a2", charge Q expressed by equation (6) below is charged on the capacitor Cs:

$$Q = Cs(Vi - Vi') \quad (6)$$

where Vi is the input voltage signal supplied to the input terminal 11; and
Vi' is an input voltage signal supplied to the inverting input terminal (−) of the operational amplifier 31.

The average current i to flow through the capacitor Cs at this time is given by:

$$i = Cs(Vi - Vi')fs \quad (7)$$

where fs is the switching frequency of the switches S1 and S2.

The resistance of the equivalent resistor R between the stationary contacts "a1" and "a2" is given by:

$$R = (Vi - Vi')/i = 1/(Cs \cdot fs) \quad (8)$$

Equation (8) is the same as equation (3). It is seen from this that the switched capacitor circuit 50 shown in FIGS. 5A and 5B is equivalent to the switched capacitor circuit 41 shown in FIG. 4.

In the mirror circuit shown in FIGS. 6A and 6B, the switched capacitor circuit 51 is used as a resistor having a negative resistance.

When the switches S1 and S2 are switched to the sides of the first stationary contact "a1" and the second stationary contact "b2", respectively, as shown in FIG. 6A, charge Q as expressed by equation (9) below is stored on the capacitor Cs:

$$Q = Cs \cdot Vi \quad (9)$$

When the switches S1 and S2 are switched to the sides of the second stationary contact "b1" and the first stationary contact "a2", respectively, as shown in FIG. 6B, charge Q expressed by equation (9) above stored on the capacitor Cs is supplied to the inverting input terminal (−) of the operational amplifier 31. Therefore, if the switching frequency fs of the switches S1 and S2 is sufficiently higher than those of the voltages Vi and Vi', an equivalent resistance circuit expressed by $R = 1/(Cs \cdot fs)$ is provided.

A conventional switched capacitor integrator to be used as a mirror integrator as in FIGS. 4, 5A and 5B, and 6A and 6B requires one power source terminal connected to reference potential Vref in addition to two power source terminals connected to two power sources VDD and VSS. Therefore, if such a switched capacitor integrator is included in a single device together with a general RANDOM LOGIC using two power sources (VDD and VSS), a reference power source terminal is required in addition to two power source terminals.

However, an increase in the number of the power source terminals presents a big problem especially in integrated circuits. More specifically, since the circuit configuration becomes complex, the time interval required for circuit design is prolonged, the chip area is increased, and the pattern design becomes complex to allow connection of three power source terminals. This also makes the design of the printed substrate complex and raises the manufacturing cost of the circuit.

FIG. 7 shows a circuit diagram of a band pass filter comprising a switched capacitor integrator as described above having switched capacitor circuits. An input voltage signal Vi supplied to an input terminal 71 is supplied to the inverting input terminal (−) of a first operational amplifier $31_1$ through an input capacitor Cs11. Power source voltages from the power sources VDD and VSS are applied to the first operational amplifier $31_1$. The output terminal of the first operational amplifier $31_1$ is connected to a switched capacitor circuit 72 of the next stage as well as to the inverting input terminal (−) thereof through a feedback capacitor Cf1. The non-inverting input terminal (+) of the first operational amplifier $31_1$ is connected to the reference potential Vref or ground. An output voltage signal Va from the first operational amplifier $31_1$ is supplied to the inverting input terminal (−) of a second operational amplifier $31_2$ through the switched capacitor circuit 72 serving equivalently as a positive resistor. Power sources VDD and VSS are connected to the second operational amplifier $31_2$. The output terminal of the second operational amplifier $31_2$ is connected to an output terminal 73 of the device as well as to the inverting input terminal (−) thereof through a feedback capacitor Cf2. The non-inverting input terminal (+) of the second operational amplifier $32_2$ is connected to the reference potential Vref or ground. The output terminal of the second operational amplifier $32_2$ is connected to the inverting input terminal (−) thereof through a switched capacitor circuit 74 serving equivalently as a positive resistor, as well as to the inverting input terminal (−) of the first operational amplifier $31_1$ through a switched capacitor circuit 75 serving equivalently as a negative resistor, so that the output signal from the second operational amplifier may be fed back to the inputs of the first and second operational amplifiers $31_1$ and $31_2$.

The mode of operation of the band pass filter of this configuration will now be described.

The input voltage signal Vi supplied to the input terminal 71 is amplified by the first operational amplifier $31_1$ in accordance with the capacitance ratio of the input capacitor Cs11 and a feedback capacitor Cf1. The first operational amplifier $31_1$, the feedback capacitor Cf1 and the switched capacitor circuit 75 together function as an integrator having an integration constant which is determined by the capacitances of the capacitors Cs12 and Cf1 and the switching frequency fs of the switches S1 and S2 of the switched capacitor circuit 75. The output voltage signal Va from the first operational amplifier $31_1$ is the sum of the amplified value of the input voltage signal Vi and the integrated value of the output voltage signal Vo. Since the switched capacitor circuit 75 with the switched capacitor Cs12 serves as a negative resistor, the integrated value of the integrated value of the output voltage signal Vo has a negative sign. The output voltage signal Va from the first operational amplifier $31_1$ becomes an input signal to the integrator consisting of the switched capacitor circuit 72, the second operational amplifier $31_2$, and the feedback capacitor Cf2. This integrator operates such that the output voltage signal Vo from the second operational amplifier $31_2$ is fed back by the switched capacitor circuit 74 and the feedback capacitor Cf2.

Thus, the output voltage signals Va and Vo from the first and second operational amplifiers $31_1$ and $31_2$ are given by:

$$Va = (Cs11/Cf1)Vi + \{Cs12/(S \cdot Cf1)\}fs \cdot Vo \quad (10)$$

$$Vo = -(Cs21/S \cdot Cf2)fs \cdot Va - (Cs22/S \cdot Cf2)fs \cdot Vo \quad (11)$$

Substitution of equation (10) in equation (11) gives a transfer function H(s) expressed as follows:

$$H(s) = Vo/Vi \quad (12)$$
$$= \{S(Cs11/Cf1) \cdot (Cs21/Cf2)fs\}/$$
$$\{S^2 + S(Cs22/Cf2)fs +$$
$$(Cs21/Cf2) \cdot (Cs12/Cf1)fs^2\}$$

It is well known that the characteristic relation of the band pass filter having the transfer function H(s) which is a quadratic function may be given as follows:

$$H(s) = (G \cdot \omega C \cdot S)/\{S^2 + (\omega C/Q)S + \omega C^2\} \quad (13)$$

where $\omega C$ is the center frequency of the band pass filter, Q is the characteristic constant, G is the filter gain, and S is the Laplacian.

If G=1, we obtain:

$$Cs11/Cf1 = 1 \quad (14)$$

$$(Cs21/Cf2)fs = (Cs12/Cf1)fs = \omega C \quad (15)$$

$$(Cs22/Cf2)fs = \omega C/Q \quad (16)$$

Therefore, a desired band pass filter may be obtained by suitably determining the respective elements expressed by equations (14), (15) and (16).

The conventional band pass filter of this type requires a power source terminal which is connected to the reference potential Vref or ground in addition to the two power source terminals which are connected to the power sources VDD and VSS for amplification. Therefore, a device including a band pass filter and a general RANDOM LOGIC using the two power sources VDD and VSS requires a reference power source terminal in addition to the two power source terminals.

However, as has been described above with reference to a conventional mirror integrator, this leads to complexity in the circuit configuration, an increase in the chip area, and complexity of pattern design due to the presence of the three power source terminals. Accordingly, the design of a printed substrate for mounting an integrated circuit becomes complex, and the manufacturing cost of the circuit is high.

SUMMARY OF THE INVENTION

The present invention has been made in consideration of the above and has for its object to provide a switched capacitor integrator which may be conveniently integrated by reducing the number of power sources required and hence the number of power source terminals required.

It is another object of the present invention to provide a band pass filter which may be conveniently integrated by reducing the number of power sources required and hence the number of power source terminals required.

BRIEF DESCRIPTION OF THE DRAWINGS

FIGS. 8A and 8B are circuit diagrams of a switched capacitor integrator according to an embodiment of the present invention;

FIGS. 9A and 9B are circuit diagrams of a switched capacitor integrator according to another embodiment of the present invention;

FIGS. 12A, 12B, 12C and 12D are circuit diagrams of a switched capacitor integrator according to still another embodiment of the present invention;

FIGS. 13A and 13B are circuit diagrams of a switched capacitor circuit according to still another embodiment of the present invention;

FIGS. 17A and 17B are circuit diagrams of a switched capacitor integrator according to still another embodiment of the present invention;

FIGS. 19A and 19B are circuit diagrams of one switched capacitor integrator alone of the band pass filter shown in FIG. 18;

DETAILED DESCRIPTION OF THE PREFERRED EMBODIMENTS

A switched capacitor integrator shown in FIGS. 8A and 8B has a switched capacitor circuit 60 which functions as a positive resistor. In the integrator shown in FIGS. 8A and 8B, the switched capacitor circuit 60 has two switches S1 and S2. The common contacts of the switches S1 and S2 are respectively connected to one end and the other end of a switched capacitor Cs. The first stationary contact "a1" of the switch S1 is connected to the input terminal 11, to which the input voltage signal Vi is applied. The first stationary contact "a2" of the switch S2 is connected to the inverting input terminal (−) of the operational amplifier 31. An input voltage signal Vi' is applied through the switched capacitor circuit 60 to the inverting input terminal (−) of the operational amplifier 31. The second stationary contacts "b1" and "b2" of the switches S1 and S2 are connected to the potential VDD as a power source, for example, the ground potential.

The operational amplifier 31 is connected to the power source VDD as a drive source, and to the reference potential. The output terminal of the operational amplifier 31 is connected to the output terminal 12. A feedback capacitor Cf is connected between the output terminal and the inverting input terminal (−) of the operational amplifier 31. A bias circuit of two series-connected resistors R1 and R2 is connected between the power source VDD and the reference potential Vref.

The non-inverting input terminal (+) of the operational amplifier 31 is connected to a junction E of the two resistors R1 and R2 of the bias circuit to receive a voltage VE which occurs between the power source voltage from the power source VDD and the reference potential Vref. The voltage VE is suitably selected in accordance with the characteristics of the operational amplifier 31. Although it may be apparent from the above description already, since the voltage VE is obtained by resistor division by the two series-connected resistors R1 and R2 connected between the power source VDD and the reference potential Vref, a separate power source for obtaining the voltage VE need not be incorporated. In order to obtain ½(VDD−Vref) as the voltage VE, it suffices to select the resistances of the resistors R1 and R2 such that they equal each other.

The mode of operation of the switched capacitor integrator shown in FIGS. 8A and 8B will now be described.

Figure 5A:
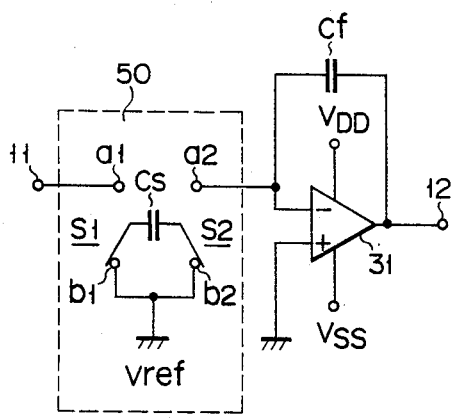
FIGS. 5A and 5B are circuit diagrams of a conventional switched capacitor integrator.

Referring to FIG. 8A, when the switches S1 and S2 are switched to the sides of the second stationary contacts "b1" and "b2" respectively, both ends of the capacitor Cs are connected to the power source VDD, and the charge on the capacitor Cs is thus discharged to zero. This state is the same as shown in FIG. 5A. When the switches S1 and S2 are connected to the sides of the first stationary contacts "a1" and "a2" respectively as shown in FIG. 8B, charge Q given by:

$$Q = Cs(Vi - Vi') \quad (17)$$

is stored on the capacitor Cs, Vi being the input voltage signal supplied to the input terminal, and Vi' being the input voltage signal supplied to the inverting input terminal (−) of the operational amplifier 31. In this case, the average current i of the capacitor Cs is given by:

$$i = Cs(Vi - Vi')fs \quad (18)$$

and the resistance of the equivalent resistor R is given by:

$$R = (Vi - Vi')/i = 1/(Cs \cdot fs) \quad (19)$$

Equation (19) is the same as equation (3) above.

Figures 1A, 1B, 2:
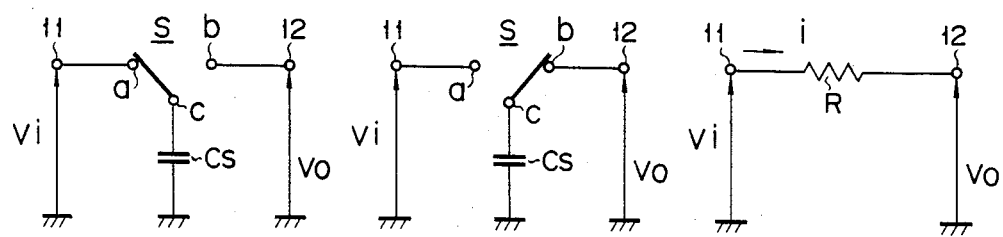
FIGS. 1A and 1B are circuit diagrams showing the basic configuration of a switched capacitor circuit.
FIG. 2 is an equivalent circuit diagram of the circuit shown in FIGS. 1A and 1B.
Figure 3:
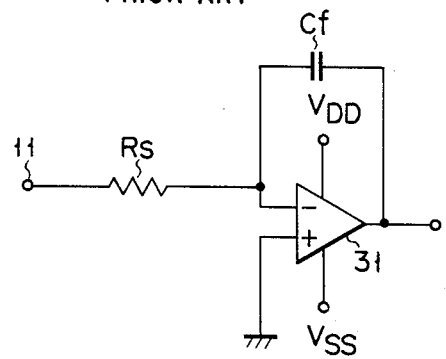
FIGS. 3 and 4 are circuit diagrams of conventional mirror integrators.
Figure 4:
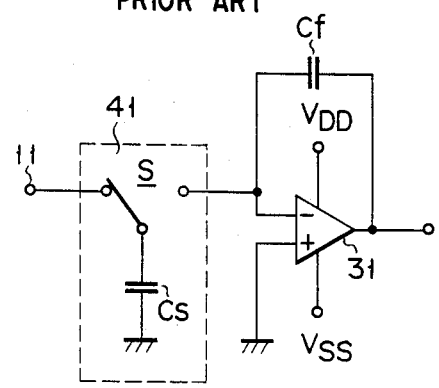
Figure 5B:
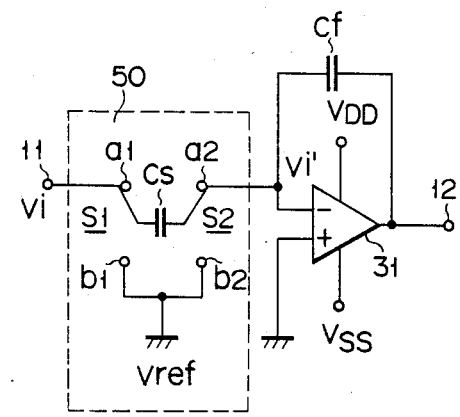

In other words, the switched capacitor integrator shown in FIGS. 8A and 8B functions in the same manner as those shown in FIGS. 4, 5A and 5B. Therefore, the integrator shown in FIGS. 8A and 8B has the input-output characteristic expressed by:

$$Vo/Vi = fs/\{S(Cf/Cs)\}$$

which is the same as that given by equation (5) above. Even if the reference potential Vref connected to the switched capacitor circuit 50 in the integrator shown in FIGS. 5A and 5B is replaced by the power source voltage of the power source VDD connected to the operational amplifier 31 as shown in FIGS. 8A and 8B, the circuit still operates as an integrator if a suitable voltage between the power source voltage from the power source VDD and the reference potential Vref is applied to the non-inverting terminal (+) of the operational amplifier 31.

FIGS. 9A and 9B show a switched capacitor integrator wherein the switched capacitor circuit functions as a negative resistor. The integrator of this embodiment has basically the same configuration as that shown in FIGS. 8A and 8B except that the connections of the switches S1 and S2 are different. Therefore, the same reference numerals denote the same parts, and a detailed description thereof will be omitted.

Referring to FIG. 9A, when the switches S1 and S2 are switched to the sides of the first stationary contact "a1" and the second stationary contact "b2", respectively, charge Q expressed by equation (9):

$$Q = Cs \cdot Vi \quad (9)$$

is stored on the capacitor Cs. When the switches S1 and S2 are switched to the sides of the second stationary contact "b1" and the first stationary contact "a2" as shown in FIG. 9B, charge Q stored on the capacitor Cs given by equation (9) above is supplied to the inverting input terminal (−) of the operational amplifier 31. Therefore, if the switching frequency fs of the switches S1 and S2 is sufficiently greater than the frequency of the input voltage signal Vi, an equivalent resistor circuit expressed by $R = 1/(Cs \cdot fs)$ is provided. A switched capacitor circuit 61 shown in FIGS. 9A and 9B is equivalent to the switched capacitor circuit 51 shown in FIGS. 6A and 6B.

According to the embodiments shown in FIGS. 8A and 8B, and 9A and 9B, the power source VSS in the conventional switched capacitor circuit shown in FIGS. 5A and 5B, and 6A and 6B may be dispensed with, so that a corresponding power source terminal may be dispensed with to facilitate integration of the circuit.

When the switched capacitor integrator of the circuit configuration as shown in FIGS. 8A and 8B, or 9A and 9B is formed into an integrated circuit, a stray capacitor Cp as shown in FIGS. 8A, 8B, 9A and 9B is connected between a connecting metal layer and the substrate or between a p-type diffusion layer and an n-type diffusion layer. The stray capacitor Cp adversely affects the operation of the circuit and it is preferable to eliminate it. Although it is possible to reduce the stray capacitance to some extend by taking certain design measures, it is almost impossible to reduce it to zero.

The problems involving the stray capacitor Cp will now be described in detail. As shown in FIGS. 8A and 8B, in an integrator using the capacitor Cs as a positive resistor, charge $Qp = -Cp \cdot VDD$ is stored on the stray capacitor Cp when the switches S1 and S2 are in the switched mode shown in FIG. 8A. In this case, since both ends of the capacitor Cs are short-circuited, no charge is stored thereon. On the other hand, when the switches S1 and S2 are switched to the switched mode shown in FIG. 8B, a feedback current If is generated through the feedback capacitor Cf by the operational amplifier 31. When the stray capacitor Cp is not present, the feedback current If flows only to the switched capacitor Cs to store charge $Qs = Cs(\frac{1}{2} \cdot VDD - Vi)$ thereon. When the stray capacitor Cp is present, the feedback current If is shunted and charge is stored on both the capacitor Cs and the stray capacitor Cp. When the integration operation is completed in the switched mode shown in FIG. 8B, the potential at the input inverting terminal (−) of the operational amplifier 31 becomes the same as that (½·VDD) at the non-inverting input terminal (+) thereof. Upon the completion of the integration operation, charge $Qp = Cp(\frac{1}{2} \cdot VDD - VDD)$ is stored on the stray capacitor Cp. In other words, when the switched mode shown in FIG. 8A is changed over to the switched mode shown in FIG. 8B, the operational amplifier 31 supplies charge $Q\Delta p = Qp2 - Qp1 = Cp \cdot \frac{1}{2} \cdot VDD$, where Qp1 is the charge stored on the stray capacitor Cp in the switched mode shown in FIG. 8A, and Qp2 is the charge stored on the stray capacitor Cp in the switched mode shown in FIG. 8B. The integrated value of a current I2 flowing to the stray capacitor Cp in one second is given by:

$$I2 = Q\Delta p \cdot fs = \frac{1}{2} \cdot (Cp \cdot VDD \cdot fs) \quad (20)$$

where Fs is the switching frequency of the switches S1 and S2.

The rate of change $Q\Delta s$ of the charge on the capacitor Cs is given by:

$$Q\Delta s = Qs2 - Qs1 = Cs(Vi - \frac{1}{2} \cdot VDD) - 0$$

and the integrated value of a current I1 flowing to the capacitor Cs is given by:

$$I1 = Q\Delta 2 \cdot fs = Cs(Vi - \frac{1}{2} \cdot VDD)fs \quad (21)$$

Therefore, the sum of the currents flowing to the stray capacitor Cp and to the capacitor Cs, or the current If flowing to the feedback capacitor Cf is given by:

$$If = I1 + I2 = Cs(Vi - \frac{1}{2} \cdot VDD)fs + \frac{1}{2} \cdot (Cp \cdot VDD \cdot fs) \quad (22)$$

If the stray capacitor Cp is absent, If=I1. Therefore, if $Vi = \frac{1}{2} \cdot VDD$, I=I1=0. Thus, the input offset voltage is $Vi = \frac{1}{2} \cdot VDD$. On the other hand, if the stray capacitor Cp is present, the input offset voltage is obtained to be:

$$Vi = \frac{1}{2} \cdot VDD - \frac{1}{2} \cdot (Cp/Cs) \cdot VDD \quad (23)$$

by substituting I=0 in equation (22).

If the stray capacitance Cp is present, the input offset voltage decreases in proportion to the ratio Cp/Cs. The implication is that the operational amplifier 31 will generate a current $I = 1/2 \ (Cp \cdot VDD \cdot fs)$ even if the input voltage signal is $\frac{1}{2} \cdot VDD$. This gives rise to a change in the integration output and, hence, in the integration constant and the input offset voltage, resulting in an erroneous operation of the integrator.

The input offset voltage of the integrator shown in FIGS. 9A and 9B is also obtained as:

$$Vi = \frac{1}{2} \cdot VDD + \frac{1}{2} \cdot (Cp/Cs) \cdot VDD \quad (24)$$

which corresponds to the input offset voltage expressed by equation (23) above. The integrator shown in FIGS. 9A and 9B uses the capacitor Cs as a negative resistor unlike the case of FIGS. 8A and 8B wherein the capacitor is used as a positive resistor. For this reason, the input offset voltage increases in proportion to the ratio Cp/Cs. Similar problems arise with the integrator shown in FIGS. 9A and 9B as those with the integrator shown in FIGS. 8A and 8B.

As may be apparent from equations (23) and (24), it suffices to reduce the ratio Cp/Cs sufficiently small and ideally to zero. This amounts to saying that the capacitance of the capacitor Cs needs to be sufficiently greater than that of the stray capacitor Cp. However, if the stray capacitor Cp has a capacitance of, for example, 0.005 pF, the capacitor Cs must have a capacitance of 5 pF or more to suppress the adverse effects of it to below 1%. In a conventional switched capacitor filter, the ratio CS/Cf is about 5 to 100. If the capacitor Cs is selected to be 5 pF or more, the feedback capacitor Cf must have a capacitance as great as 25 to 500 pF. When the circuit is to be formed into an integrated circuit, incorporation of a feedback capacitor Vf of such a great capacitance results in an increase in the chip size and an increase in the manufacturing cost.

The problem caused by the presence of the stray capacitor Cp may be eliminated with the arrangement shown in FIGS. 10A to 10D or in FIGS. 11A to 11D.

FIGS. 10A to 10D show a switched capacitor integrator which uses a switched capacitor circuit as a positive resistor. In the integrator shown in FIGS. 10A to 10D, the first stationary contact "a1" of the switch S1 whose common contact is connected to one end of the capacitor Cs is connected to the power source VDD. The second stationary contact "b1" of the switch S1 is connected to the input terminal 11 to which the input voltage signal Vi is supplied. A third stationary contact "c1" of the switch S1 is connected to a reference potential Vref, for example, ground. A common contact of the switch S2 is connected to the other end of the capacitor Cs. The first stationary contact "a2" of the switch S2 is connected to the power source VDD, and the second stationary contact "b2" is connected to the inverting input terminal (−) of the operational amplifier 31. A third stationary contact "c2" is connected to the reference potential Vref or ground. The power source voltage from the power source VDD and a ground voltage are applied to the operational amplifier 31. The output terminal of the operational amplifier 31 is connected to the output terminal 12 of the device or the integrator as well as to the inverting input terminal (−) thereof through the feedback capacitor Cf. A bias circuit of two series-connected resistors R1 and R2 is connected between the power source VDD and the reference potential Vref. A junction E of the resistors R1 and R2 is connected to the non-inverting input terminal (+) of the operational amplifier 31, and a voltage VE at the junction E is applied thereto.

The mode of operation of the switched capacitor integrator of the configuration as shown in FIGS. 10A to 10D will now be described.

Figure 10B:
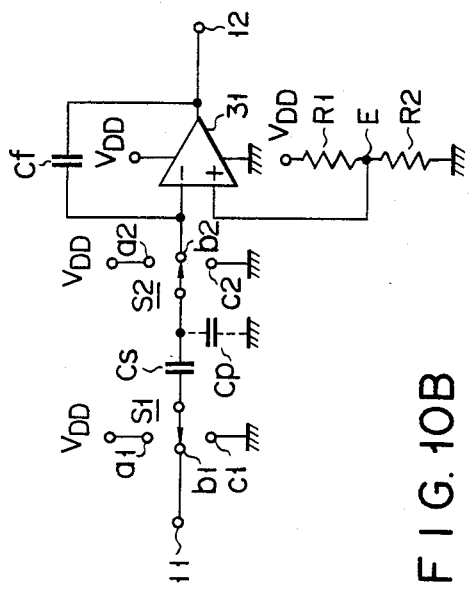
FIGS. 10A, 10B, 10C and 10D are circuit diagrams of a switched capacitor integrator according to still another embodiment of the present invention.
Figure 10D:
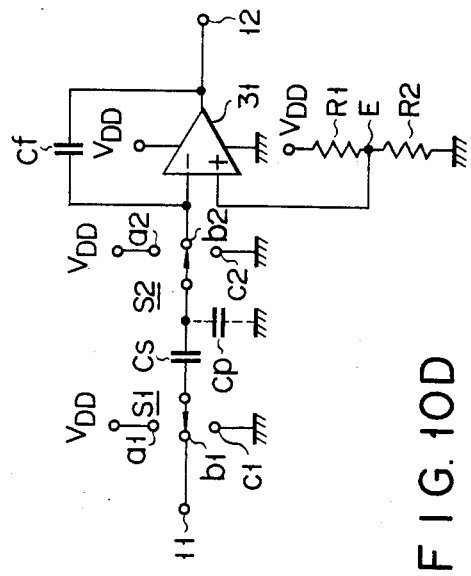
Figure 10A:
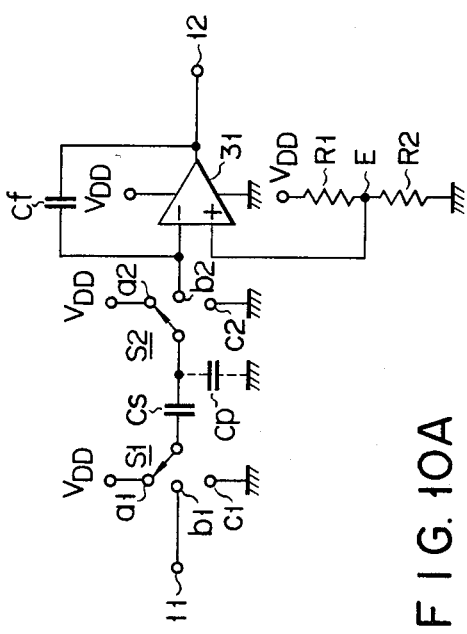
Figure 10C:
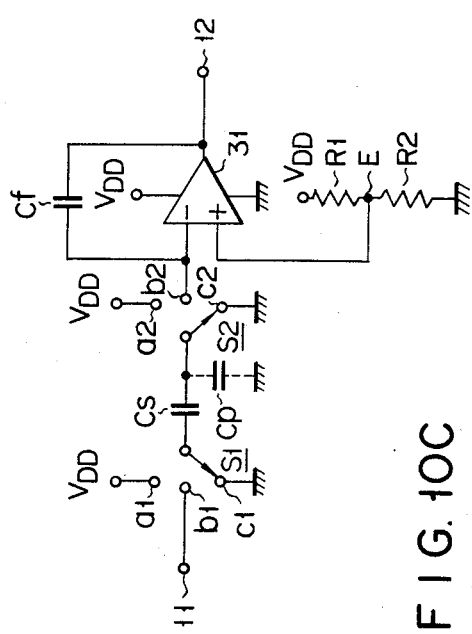
Figure 11B:
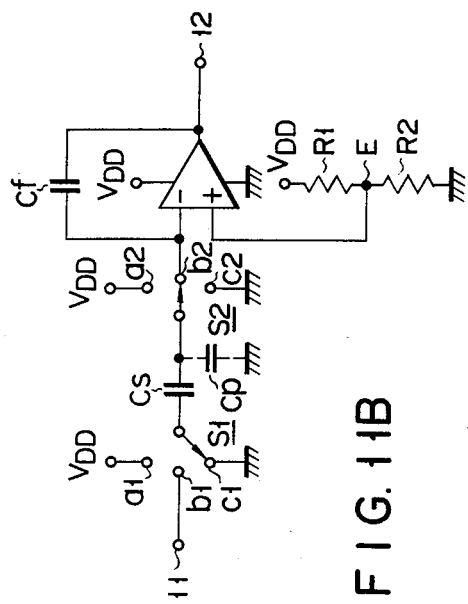
FIGS. 11A, 11B, 11C and 11D are circuit diagrams of a switched capacitor integrator according to still another embodiment of the present invention.
Figure 11D:
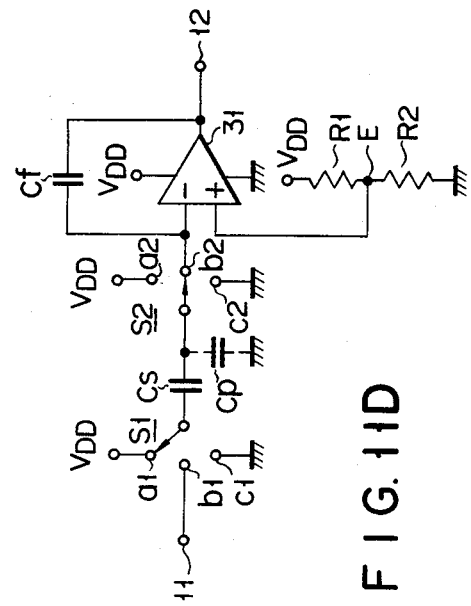
Figure 11A:
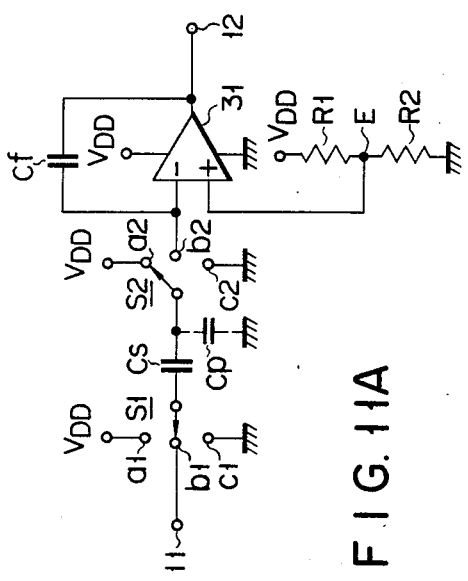
Figure 11C:
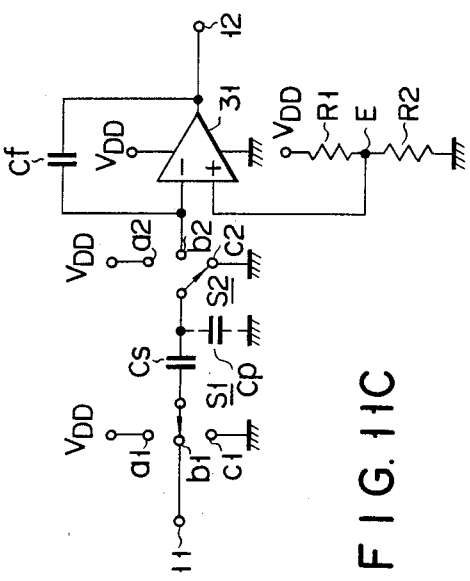

When the switches S1 and S2 are switched to the sides of the first stationary contacts "a1" and "a2" respectively as in the first switched mode shown in FIG. 10A, charge Qs1 stored on the capacitor Cs is zero. On the other hand, charge $Qp1 = -Cp \cdot VDD$ is stored on the capacitor Cp. When the switches S1 and S2 are switched to the sides of the secondary stationary contacts "b1" and "b2" respectively in the second switched mode as shown in FIG. 10B, charge $Qs2 = Cs(Vi - \frac{1}{2} \cdot VDD)$ is stored on the capacitor Cs and charge $Qp2 = -Cp \cdot \frac{1}{2} \cdot VDD$ is stored on the capacitor Cp. In the third switched mode shown in FIG. 10C wherein the switches S1 and S2 are switched to the sides of the third stationary contacts "c1" and "c2" respectively, charge Qs3 stored on the capacitor Cs and charge stored on the capacitor Qp are both zero. In the fourth switched mode shown in FIG. 10D wherein the switches S1 and S2 are switched to the sides of the second stationary contacts "b1" and "b2", charge $Qs4 = Cs(Vi - \frac{1}{2} \cdot VDD)$ is stored on the capacitor Cs, while charge $Qp4 = -Cp \cdot \frac{1}{2} \cdot VDD$ is stored on the capacitor Cp.

A total amount of charge transfer ΔQ from the first to fourth switched modes in the integration operation as described above is given by:

$$\Delta Q = (Qs2 - Qs1) + Qs4 - Qs3) + \quad (25)$$

-continued $$(Qp2 - Qp1) + (Qp4 - Qp3) =$$

$$2Cs(Vi - \tfrac{1}{2} \cdot VDD) + \tfrac{1}{2}(Cp \cdot VDD) -$$

$$\tfrac{1}{2}(Cp \cdot VDD) = 2Cs(Vi - \tfrac{1}{2} \cdot VDD)$$

Therefore, the feedback current If is given by:

$$If = \Delta Q(fs/2) = Cs(Vi - \tfrac{1}{2} \cdot VDD)fs \tag{26}$$

where fs is the switching frequency of the switches S1 and S2.

The equivalent resistor R of this switched capacitor circuit will have a resistance given by:

$$R = (Vi - \tfrac{1}{2} \cdot VDD)/If = 1/(Cs \cdot fs) \tag{27}$$

As may be apparent from equation (27) above, the equivalent resistor R is independent of the stray capacitor Cp.

FIGS. 11A to 11D show another embodiment of the present invention. The embodiment shown in FIGS. 11A to 11D uses a switched capacitor circuit as a negative resistor, while the embodiment shown in FIGS. 10A to 10D uses the switched capacitor circuit as a positive resistor. In other respects, the embodiment shown in FIGS. 11A to 11D remains the same as that shown in FIG. 10A to 10D, so the same reference numerals denote the same parts and a detailed description thereof will be omitted. In the embodiment shown in FIGS. 11A to 11D, the connections of the switches S1 and S2 in the respective switched modes differ from those in the case of FIGS. 10A to 10D. In the first switched mode shown in FIG. 11A, the switch S1 is switched to the side of the second stationary contact "b1", while the switch S2 is switched to the side of the first stationary contact "a2". In the second switched mode shown in FIG. 11B, the switch S1 is switched to the side of the third stationary contact "c1", while the switch is switched to the second stationary contact "b2". In the third switched mode shown in FIG. 11C, the switch S1 is connected to the side of the second stationary contact "b1", while the switch S2 is connected to the side of the third stationary contact "c2". In the fourth switched mode shown in FIG. 11D, the switch S1 is connected to the side of the first stationary contact "a1", while the switch S2 is connected to the side of the second stationary contact "b2".

The total amount of charge transfer $\Delta Qp$ through one cycle of the first to fourth switched modes is given by:

$$\Delta Qp = (Qp2 - Qp1) + (Qp4 - Qp3) \tag{28}$$

$$= \{-Cp \cdot \tfrac{1}{2} \cdot VDD - (-Cp \cdot VDD)\} +$$

$$(-Cp \cdot \tfrac{1}{2} \cdot VDD - 0) = 0$$

It is seen from equation (28) above that the stray capacitor Cp does not adversely affect the integration operation in the embodiment shown in FIGS. 11A to 11D.

In the above embodiments, the stray capacitor Cp has been explained as a linear capacitor. However, a switching element in an integrated circuit comprises a MOS (Metal Oxide Semiconductor Field Effect Transistor). Therefore, a diffusion junction capacitor which is a non-linear capacitor is formed. A diffusion junction capacitor must also be considered as one type of stray capacitor in the integrated circuit. In other words, the device must be able to eliminate the adverse effects of the non-linear capacitance.

FIGS. 12A to 12D are circuit diagrams for explaining the measures to be taken to solve this problem wherein junction capacitors Cjp and Cjn are added to the circuit shown in FIGS. 10A to 10D. The junction capacitor Cjn is formed between an n-type diffusion layer and a p-type substrate, while the junction capacitor Cjp is formed between a p-type diffusion layer and an n-type substrate.

Charge on the junction capacitor Cjp changes as follows, in the switched modes shown in FIGS. 12A to 12D. Reference symbols Cjp and Cjn with potential symbols (VDD) or ($\tfrac{1}{2}$·VDD) represent capacitances of the junction capacitors Cjp and Cjn when these potential differences are established.

In the switched mode shown in FIG. 12A: "0"
In the switched mode shown in FIG. 12B: "Cjp$_{(\tfrac{1}{2} \cdot VDD)}$·$\tfrac{1}{2}$·VDD"
In the switched mode shown in FIG. 12C: "Cjp$_{(VDD)}$·VDD"
In the switched mode shown in FIG. 12D: "Cjp$_{(\tfrac{1}{2} \cdot VDD)}$·$\tfrac{1}{2}$·VDD"

On the other hand, charge on the junction capacitor Cjn changes as follows:

In the switched mode shown in FIG. 12A: "−Cjn$_{(\tfrac{1}{2} \cdot VDD)}$·VDD"
In the switched mode shown in FIG. 12B: "−Cjn$_{(\tfrac{1}{2} \cdot VDD)}$·$\tfrac{1}{2}$·VDD"
In the switched mode shown in FIG. 12C: "0"
In the switched mode shown in FIG. 12D: "−Cjn$_{(\tfrac{1}{2} \cdot VDD)}$·$\tfrac{1}{2}$·VDD"

The total amount of charge transfer $\Delta Q$ at the stray capacitor is the sum of amounts of charge transfer in the junction capacitors Cjp and Cjn in the respective switched modes, and so is given by:

$$\Delta Q = Cjp_{(\tfrac{1}{2} \cdot VDD)} \cdot \tfrac{1}{2} \cdot VDD - 0 + \tag{29}$$

$$Cjp_{(\tfrac{1}{2} \cdot VDD)} \cdot \tfrac{1}{2} \cdot VDD - Cjp_{(VDD)} \cdot VDD -$$

$$Cjp_{(\tfrac{1}{2} \cdot VDD)} \cdot \tfrac{1}{2} \cdot VDD + Cjn_{(VDD)} \cdot VDD -$$

$$Cjn_{(\tfrac{1}{2} \cdot VDD)} \cdot \tfrac{1}{2} \cdot VDD - 0 =$$

$$VDD(Cjp_{(\tfrac{1}{2} \cdot VDD)} - Cjp_{(VDD)}) -$$

$$VDD(Cjn_{(\tfrac{1}{2} \cdot VDD)} - Cjn_{(VDD)})$$

It is seen from equation (29) above that the differences between the junction capacitances of the junction capacitors Cjp and Cjn between time when the potential $\tfrac{1}{2}$·VDD is established and time when the potential VDD is established affects the charge stored on the stray capacitor.

A means will now be described whereby the total amount of charge transfer $\Delta Q$ expressed by equation (29) is reduced to zero and the adverse effects of the junction capacitors are eliminated. In equation (29) above, Cjp$_{(\tfrac{1}{2} \cdot VDD)}$, Cjp$_{(VDD)}$, Cjn$_{(\tfrac{1}{2} \cdot VDD)}$ and Cjn$_{(VDD)}$ each represent capacitances. Since each of these capacitances is the product of the capacitance per unit area and the junction area, equation (29) may be rewritten as:

$$\Delta Q = VDD \cdot Ajp(C'jp_{(\tfrac{1}{2} \cdot VDD)} - C'jp_{(VDD)}) - VDD \cdot Ajn(C'jn_{(\tfrac{1}{2} \cdot VDD)} - C'jn_{(VDD)}) \tag{30}$$

where Ajp and Ajn are junction areas of the junction capacitors Cjp and Cjn, respectively, and C'jp and C'jn are junction capacitances per unit area. Therefore, the value of the total amount of charge transfer ΔQ in equation (29) may be reduced to zero by setting the ratio of the area of the p-type diffusion layer to that of the n-type diffusion layer so as to satisfy:

$$Ajp/Ajn = (Cjn_{(\frac{1}{2} \cdot VDD)} - Cjn_{(VDD)})/(Cjp_{(\frac{1}{2} \cdot VDD)} - Cjp_{(VDD)}) \quad (31)$$

The ratio of the areas of the diffusion layers may be easily determined during designing an integrated circuit.

Another means for reducing the adverse effects of a stray capacitor may be adopted which performs (M+N) switching operations during one switching cycle. According to this means, the switching operation of the switched modes shown in FIGS. 12A and 12B is performed M times within one cycle, and the switching operation of the switched modes shown in FIGS. 12C and 12D is performed N times. In this case, the total amount of charge transfer, including the case of a linear stray capacitor, is given by:

$$\Delta Q = \frac{1}{2} \cdot Cp_{(VDD)} \cdot M - \frac{1}{2} \cdot Cp_{(VDD)} \cdot N = \quad (32)$$

$$(Cjp_{(\frac{1}{2} \cdot VDD)} \cdot \frac{1}{2} \cdot VDD - 0) \cdot M +$$

$$(Cjp_{(\frac{1}{2} \cdot VDD)} \cdot \frac{1}{2} \cdot VDD - Cjp_{(VDD)} \cdot VDD) \cdot N =$$

$$(-Cjn_{(\frac{1}{2} \cdot VDD)} \cdot \frac{1}{2} \cdot VDD + Cjp_{(VDD)} \cdot VDD) \cdot M +$$

$$(-Cjn_{(\frac{1}{2} \cdot VDD)} \cdot VDD - 0) \cdot N$$

Therefore, $$\Delta Q = \frac{1}{2} \cdot VDD\{Cp(M - N) + Cjp_{(\frac{1}{2} \cdot VDD)} \cdot (M + N) - \quad (33)$$

$$Cjp_{(VDD)} \cdot 2 \cdot n - (Cjn_{(\frac{1}{2} \cdot VDD)} \cdot (M + N) -$$

$$Cjn_{(VDD)} \cdot 2 \cdot M\}$$

Equation (26) may be modified, as in the case of equation (23), as follows:

$$\Delta Q = \frac{1}{2} \cdot VDD[Ap \cdot C'p(M - N) + \quad (34)$$

$$Ajp\{Cjp_{(\frac{1}{2} \cdot VDD)} \cdot (M + N) - Cjp_{(VDD)} \cdot 2 \cdot N$$

$$Ajp\{Cjn_{(\frac{1}{2} \cdot VDD)} \cdot (M + N) - Cjn_{(VDD)} \cdot 2 \cdot M\}]$$

It is seen from equation (34) that the adverse effects of the stray capacitor may be reduced to the minimum by suitably selecting the values of M and N. Especially if the area ratio Ajp/Ajn in equation (31) is too great, the adverse effects of the stray capacitance may be reduced to the minimum by suitably setting the area ratio as well as by suitably determining the values of M and N.

The description has been made on the case of reducing the adverse effects of the stray capacitance when the switched capacitor is used as a positive capacitor. However, it is to be noted that the adverse effects of the stray capacitance may be reduced to the minimum in a similar manner in an integrator wherein the switched capacitor is used as a negative capacitor.

In the switched capacitor integrators shown in FIGS. 11A to 11D and FIGS. 12A to 12D, since the charge stored on the stray capacitor is sequentially discharged to two power sources for the operational amplifier and is not input to the operational amplifier, the adverse effects of the stray capacitance may be eliminated. Therefore, the integrators can produce integration outputs with high precision, can be operated with two power sources, and can be readily integrated.

FIGS. 13A and 13B show another embodiment of the present invention which uses a switched capacitor circuit as a negative resistor. According to this embodiment, the power source connected to the second stationary contact "b1" of the switch S1 in the embodiment shown in FIGS. 9A and 9B is changed from the reference potential Vref to the power source VDD, the power source connected to the second stationary contact "b2" of the switch S2 is changed from the power source VDD to the power source VSS, and one power source of the operational amplifier 31 is changed from the reference potential Vref to the power source VSS. The reference potential Vref as one of the power sources of the bias circuit is replaced by the power source VSS. The two resistors R1 and R2 of the bias circuit are respectively replaced by n-channel field effect transistors T1 and T2. The drain of the transistor T1 is connected to the power source VDD, and the source thereof is connected to the drain of the transistor T2. The source of the transistor T2 is connected to the power source VSS. The gate of the transistor T1 is connected to its own drain. Similarly, the gate of the transistor T2 is connected to its own drain. A junction E of the source of the transistor T1 and the gate of the transistor T2 is connected to the non-inverting input terminal (+) of the operational amplifier 31, so that a voltage VE at the junction E is applied thereto. The transistors T1 and T2 of the same characteristics need only be used in order to make the voltage Ve equal ½·(VDD−VSS), for example.

The mode of operation of the switched capacitor integrator of the configuration as described above will now be described.

When the switch S1 is switched to the side of the first stationary contact "a1" and the switch S2 is connected to the side of the second stationary contact "b2" as in the first switched mode shown in FIG. 13A, the potential difference "Vi−VSS" is established across both ends of the switched capacitor Cs. If VSS=0, charge Qa=Cs·Vi is stored on the switched capacitor Cs. Next, when the switch S1 is connected to the side of the second stationary contact "b1" and the switch S2 is connected to the side of the first stationary contact "a2" as in the second switched mode shown in FIG. 13B, the potential difference "VDD−Vi'" is established across both ends of the switched capacitor Cs. In this case, charge Qb=Cs(VDD−Vi') is stored on the switched capacitor Cs. Therefore, the total amount of charge transfer ΔQ upon switching from the first switched mode to the second switched mode is given by:

$$\Delta Q = -(Qa - Qb) \quad (35)$$

$$= -Cs(Vi + Vi' - VDD)$$

If the non-inverting input terminal (+) of the operational amplifier 31 is kept at a potential of "VDD/2" and the transistors T1 and T2 are of the same characteristics, and the operational amplifier 31 functions to make the input voltage signal Vi'equal "VDD/2". Then, substitution of Vi'=VDD/2 in equation (35) yields:

$$\Delta Q = -Cs(Vi - Vi')$$

Therefore, the average current I flowing between the contacts "a1" and "a2" and the resistance of the equivalent resistor R are given by:

$$I = \Delta Q \cdot fs = -Cs(Vi - Vi') \cdot fs \quad (36)$$

$$R = (Vi - Vi')/I = -\{1/(Cs \cdot fs)\} \quad (37)$$

Equations (36) and (37) above are the same as equations (7) and (8) except the signs are inverted. It is seen from this that the switched capacitor circuit shown in FIGS. 13A and 13B serves as a negative resistor.

Figure 6A:
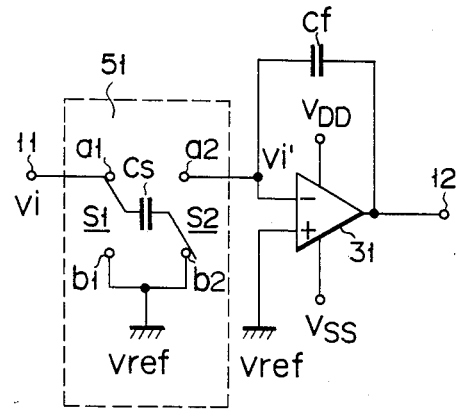
FIGS. 6A and 6B are circuit diagrams of another conventional switched capacitor integrator.
Figure 6B:
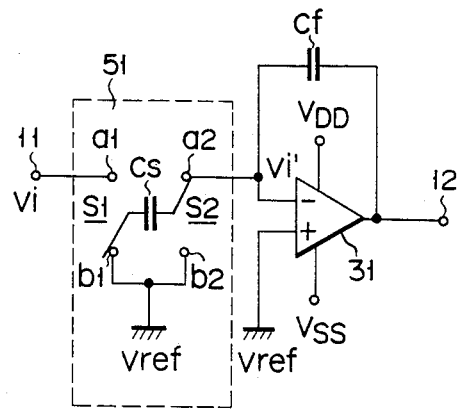

In other words, the switched capacitor integrator shown in FIGS. 13A and 13B functions in the same manner as that shown in FIGS. 6A and 6B. Therefore, the input-output characteristic of the switched capacitor integrator shown in FIGS. 13A and 13B is given by:

$$Vo/Vi = \{Cs/(S \cdot cf)\} \cdot fs \quad (38)$$

Figure 14:
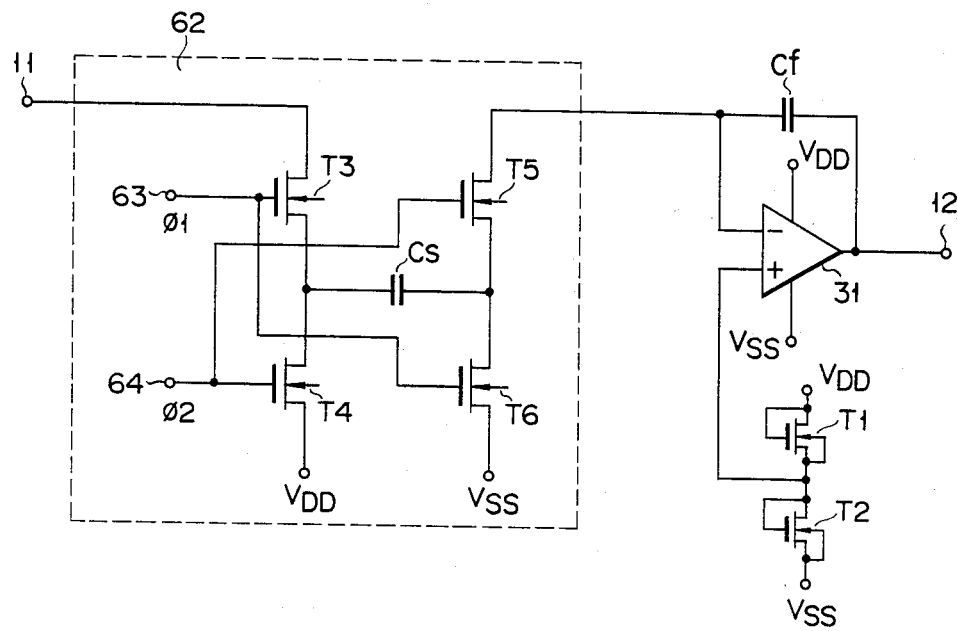
FIG. 14 is a detailed circuit diagram of the switched capacitor circuit shown in FIGS. 13A and 13B.
Figure 15A:
FIGS. 15A and 15B show the waveforms of control pulse signals supplied to the switched capacitor integrator shown in FIG. 14.
Figure 15B:
Figure 16A:
FIGS. 16A and 16B show other waveforms of the control pulse signals shown in FIGS. 15A and 15B.
Figure 16B:

FIG. 14 shows a circuit diagram of an integrated circuit of a switched capacitor circuit 62 in the switched capacitor integrator shown in FIGS. 13A and 13B. In the switched capacitor circuit 62 shown in FIG. 14, reference symbols T3 to T6 denote n-channel field effect transistors. The transistor T3 serving as the first switching element and the transistor T4 serving as the second switching element constitute the switch S1 of a switched capacitor circuit 62 shown in FIGS. 13A and 13B. The transistor T5 serving as the third switching element and the transistor T6 serving as the fourth switching element constitute the switch S2. Control pulses ∅1 and ∅2 (FIGS. 15A and 15B or FIGS. 16A and 16B) are supplied such that the transistors T3 and T6 serving as the first and fourth switching elements may be in the same switched state while the transistors T4 and T5 serving as the second and third switching elements may be in the same switched state. As for the connections of the transistors T3 to T6, the drain of the transistor T3 is connected to an input terminal 11, and the source of the transistor T4 is connected to the power source VDD. The source of the transistor T3 is connected to the drain of the transistor T4, and one end of the switched capacitor Cs is connected to a junction thereof. The drain of the transistor T5 is connected to the inverting input terminal (−) of the operational amplifier 31, and the source of the transistor T6 is connected to the power source VSS. The source of the transistor T5 and the drain of the transistor T6 are commonly connected, and the other end of the switched capacitor Cs is connected to a junction thereof. The gates of the transistors T3 and T6 are connected to a first clock input terminal 63, while the gates of the transistors T4 and T5 are connected to a second clock inout terminal 64. The clock pulses ∅1 and ∅2 (FIGS. 15A and 15B or FIGS. 16A and 16B) having a period of 1/fs and whose durations of logic level "1" may not overlap each other are respectively supplied to the terminals 63 and 64. When the clock pulse ∅1 is at logic level "1" while the clock pulse ∅2 is at logic level "0", the transistors T3 and T6 are ON and the transistors T4 and T5 are OFF, establishing the switched mode shown in FIG. 13A. On the other hand, when the clock pulse ∅1 is at logic level "0" while the clock pulse ∅2 is at logic level "1", the transistors T3 and T6 are OFF and the transistors T4 and T5 are ON, establishing the switched mode shown in FIG. 13B.

In the circuit shown in FIG. 14, the transistors T3 to T6 serve as the first to fourth switching elements. However, analog switches, for instance, transmission gates may be used instead.

FIGS. 17A and 17B show still another embodiment of the present invention. In this embodiment, the power sources VDD and VSS in the switched capacitor circuit of the embodiment shown in FIGS. 13A and 13B are replaced by each other. Therefore, the same reference numerals denote the same parts, and a detail description thereof will be omitted. As in the embodiment shown in FIGS. 13A and 13B, the switched capacitor circuit may function as a negative resistor in this embodiment.

In the embodiments shown in FIGS. 13A and 13B and in FIGS. 17A and 17B, the number of power sources required is smaller than that of the conventional switched capacitor circuit, so that the circuit may be more readily formed into an integrated circuit.

Figure 18:
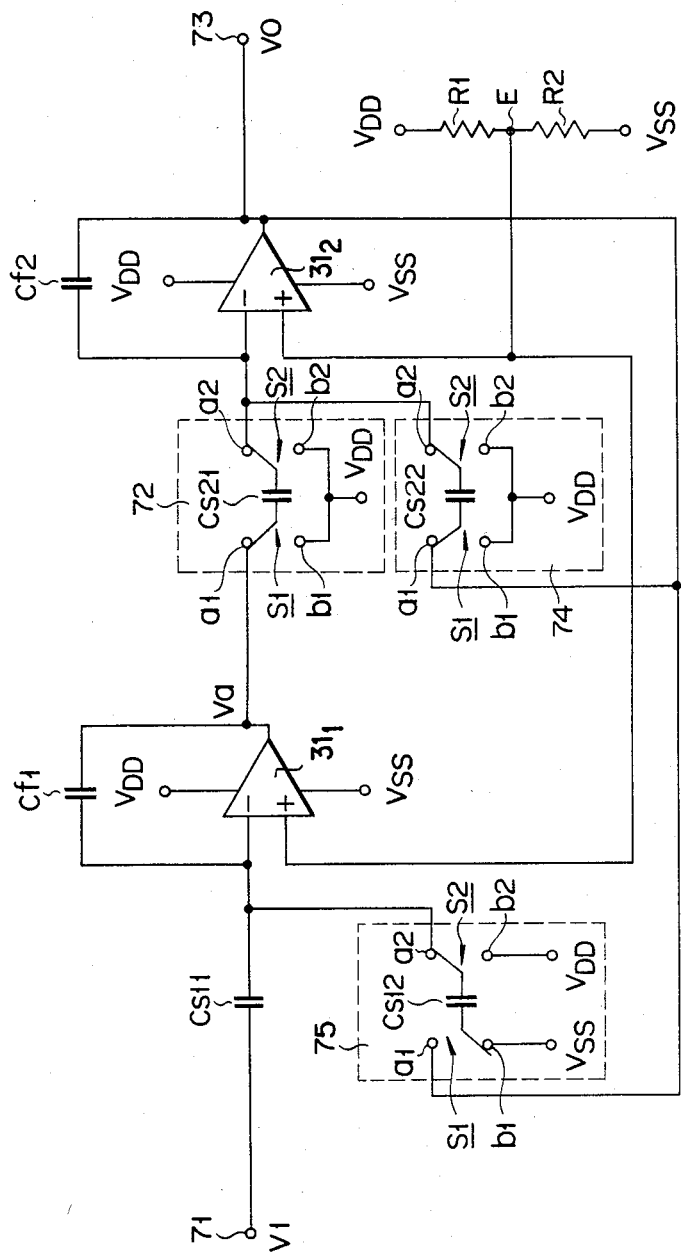
FIG. 18 is a circuit diagram of a band pass filter according to still another embodiment of the present invention.

FIG. 18 shows a circuit diagram of a band pass filter incorporating the switching capacitor integrator of the embodiments described above.

Referring to FIG. 18, an input terminal 71 is connected through an input capacitor Cs1 to the inverting input terminal (−) of a first operational amplifier 31₁. An input voltage signal Vi is applied to the input terminal 71, and is then applied to the inverting input terminal (−) of the first operational amplifier 31₁. Two power sources VDD and VSS are connected to the first operational amplifier 31₁. The output terminal of the first operational amplifier 31₁ is connected to a switched capacitor circuit 72 of the next stage serving as a positive resistor as well as to the inverting input terminal (−) thereof through a feedback capacitor Cf1. The non-inverting input terminal (+) of the first operational amplifier 31₁ is connected to a junction E of resistors R1 and R2 which are series-connected between the power sources VDD and VSS and which constitute a bias circuit. The non-inverting input terminal (+) of the first operational amplifier 31₁ receives the voltage VE at the junction E. The output terminal of the first operational amplifier 31₁ is connected through the switched capacitor circuit 72 to the inverting input terminal (−) of a second operational amplifier 31₂. An output voltage signal Va from the first operational amplifier 31₁ is supplied to the inverting input terminal (−) of the second operational amplifier 31₂ through the switched capacitor circuit 72. The power sources VDD and VSS are connected to the second operational amplifier 31₂, the output terminal of which is connected to an output terminal 73 of the device or the band pass filter as well as to the inverting input terminal (−) thereof through a second feedback capacitor Cf2. The output terminal of the second operational amplifier 31₂ is further connected to its inverting-input terminal (−) through a switched capacitor circuit 74 serving as a positive resistor as well as to the inverting input terminal (−) of the first operational amplifier 31₁ through a switched capacitor circuit 75 serving as a negative resistor. Therefore, the output signal from the second operational amplifier 31₂ is fed back to its inverting input terminal (−) through the switched capacitor circuit 74 as well as to the inverting input terminal (−) of the first operational amplifier 31₁ through the switched capacitor circuit 75. As in the case of the first operational amplifier 31₁, the output terminal of the second operational amplifier 31₂ is connected to the junction E of the resistors R1 and R2 to receive the voltage VE at this junction E. The switched capacitor circuit 72 serving as a positive resistor comprises a switch S1 and a switch S2. In the switch S1 of the circuit 72, a switched capacitor Cs21 and the first stationary contact "a1" are connected to the output terminal of the first operational amplifier $31_1$, the second stationary contact "b1" is connected to the power source VDD, and the common contact is connected to one end of the switched capacitor Cs21. In the switch S2 of the circuit 72, the first stationary contact "a2" is connected to the inverting input terminal (−) of the second operational amplifier $31_2$, the second stationary contact "b2" is connected to the power source VDD, and the common contact is connected to the other end of the switched capacitor Cs21. The switched capacitor circuit 74 also serving as a positive resistor comprises another switch S1 and another switch S2. In the switch S1 of the circuit 74, a switched capacitor Cs22 and the first stationary contact "a1" are connected to the output terminal of the second operational amplifier $31_2$, the second stationary contact "b1" is connected to the power source VDD, and the common contact is connected to one end of the switched capacitor CS22. In the switch S2 of the circuit 74, the first stationary contact "a2" is connected to the inverting input terminal (−) of the second operational amplifier $31_2$, the second stationary contact "b2" is connected to the power source VDD, and the common contact is connected to the other end of the switched capacitor Cs22. The switched capacitor circuit 75 serving as a negative resistor comprises still another switch S1 and still another switch S2. In the switch S1 of the circuit 75, the switched capacitor Cs12 and the first stationary contact "a1" are connected to the output terminal of the second operational amplifier $31_2$, the second stationary contact "b1" is connected to the power source VSS, and the common contact is connected to one end of the switched capacitor Cs12. In the switch S2 of the circuit 75, the first stationary contact "a2" is connected to the inverting input terminal (−) of the first operational amplifier $31_1$, the second stationary contact "b2" is connected to the power source VDD, and the common contact is connected to the other end of the switched capacitor CS12.

Figure 7:
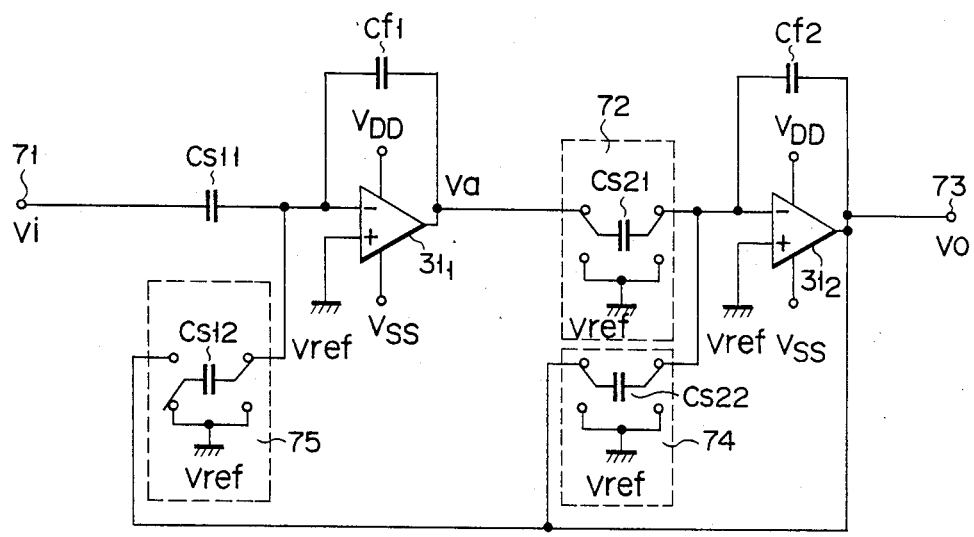
FIG. 7 is a circuit diagram of a conventional band pass filter having the switched capacitor circuits shown in FIGS. 6A and 6B.

This embodiment is different from the conventional band pass filter shown in FIG. 7 in that a bias circuit is incorporated. This bias circuit supplies a power source voltage from the power source VDD to the second stationary contacts "b1" and "b2" of the switched capacitor circuits 72 and 74, supplies a power source voltage from the power source VSS to the second stationary contact "b1" of the switch S1, supplies the power source voltage from the power source VDD to the second stationary contact "b2" of the switch S2, and supplies a suitable bias voltage between the power source voltages from the power sources VDD and VSS to the non-inverting input terminals (+) of the first and second operational amplifiers $31_1$ and $31_2$.

The mode of mirror integrator incorporating the switched capacitor circuit 72 as a positive resistor will now be described with reference to the band pass filter shown in FIG. 18. FIGS. 19A and 19B show the mirror integrator alone, using the switched capacitor circuit 72 as a positive resistor, from the band pass filter shown in FIG. 18.

In the second switched mode shown in FIG. 19A wherein the common contacts of the switches S1 and S2 are respectively connected to the second stationary contacts "b1" and "b2", both ends of the switched capacitor Cs11 are short-circuited to the power source VDD. Therefore, the charge on the switched capacitor Cs11 is discharged to zero. When the switched mode is switched to the first switched mode, that is, when the common contacts of the switches S1 and S2 are respectively connected to the first stationary contacts "a1" and "a2" as shown in FIG. 19B, on the switched capacitor Cs11 is stored charge:

$$Q = Cs11(Vi - Vi')  \quad (39)$$

where Vi is the input voltage signal supplied to the input terminal 71; and

Vi' is the input voltage signal supplied to the inverting input terminal of the operational amplifier 31. The average current flowing to the switched capacitor Cs11 at this time is given by:

$$i = Cs11(Vi - Vi')fs \quad (40)$$

And the resistance of the equivalent resistor R is given by:

$$R = (Vi - Vi')/i = 1/(Cs11 \cdot fs) \quad (41)$$

Equation (41) is substantially the same as equation (3) above. Therefore, the circuit shown in FIGS. 19A and 19B functions in the same manner as that shown in FIGS. 5A and 5B, and the input-output characteristic of this mirror integrator is given by:

$$Va/Vi = fs/\{S(Cf1/Cs11)\}$$

which is substantially the same as equation (5). Even if the reference power source Vref connected to the switched capacitor circuit 50 in the circuit shown in FIGS. 5A and 5B is replaced by the power source VDD as the driving power source of the operational amplifiers $31_1$ and $31_2$ as shown in FIGS. 19A and 19B, the mode of operation of the mirror integrator remains the same. A mirror integrator which uses a switched capacitor circuit as a positive resistor functions substantially in the same manner as the mirror circuit described above, and a description thereof will be omitted.

Figure 20A:
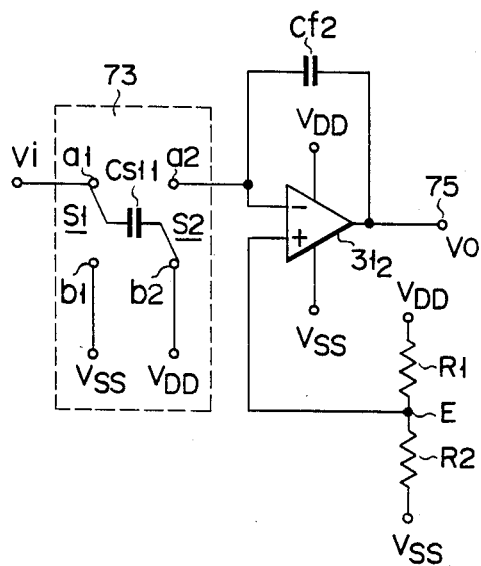
FIGS. 20A and 20B are circuit diagrams, similar to FIGS. 19A and 19B, which show the other switched capacitor integrator of the band pass filter shown in FIG. 18.
Figure 20B:
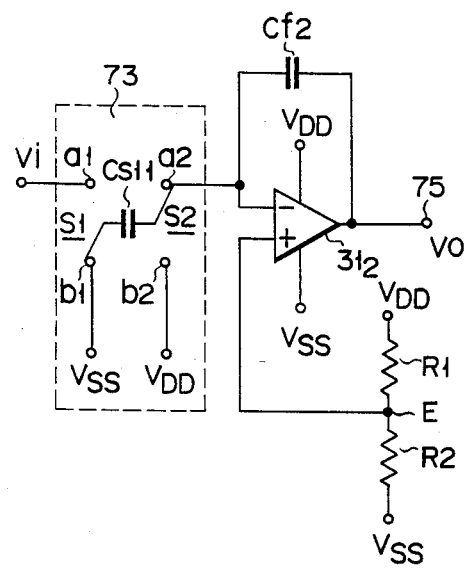

FIGS. 20A and 20B are circuit diagrams showing a mirror integrator which uses a switched capacitor circuit 73 as a negative resistor in the band pass filter shown in FIG. 18. When the switches S1 and S2 are in the second switched mode as shown in FIG. 20A, that is, when the common contacts of the switches S1 and S2 are respectively switched to the sides of the first stationary contact "a1" and the second stationary contact "b2", a potential difference (Va=VDD) is established across the switched capacitor Cs11. Therefore, charge Qa given by:

$$Qa = Cs11(Va - VDD)$$

is stored on the switched capacitor Cs21.

Then, as shown in FIG. 20B, when the common contact of the switch S1 is switched to the second stationary contact "b1" and the common contact of the switch S2 is switched to the first stationary contact "a2", a potential difference (VSS−Va') is established across the switched capacitor Cs11. In this case, charge Qb given by:

$$Qb = Cs11(VSS - Va')$$

is stored on the switched capacitor Cs11.

Substitution of VSS=0 in the above equations yields the total amount of charge transfer ΔQ:

$$\Delta Q = -(Qa-Qb) = -Cs11(Va+Va'-VDD) \quad (42)$$

Since a voltage VDD/2 is applied to the non-inverting terminal (+) of the first operational amplifier $31_1$ by the bias circuit, substitution of Va=VDD/2 in equation (42) gives:

$$\Delta Q = -Cs11(Va-Va')$$

Then, the average current i flowing across the contacts "a1" and "a2" and the resistance of the equivalent resistor R are respectively given by the following equations:

$$i = \Delta Q \cdot fs = -Cs21(Va-Va')fs \quad (43)$$

$$R = (Va-Va')/i = 1/(Cs11 \cdot fs) \quad (44)$$

Equations (43) and (44) are substantially the same as equations (40) and (41) above except that the signs are inverted. It follows from this that the switched capacitor circuit shown in FIGS. 20A and 20B functions as a negative resistor as well. The circuit shown in FIGS. 20A and 20B functions in the same manner as that shown in FIGS. 6A and 6B, and the input-output characteristic of this circuit is given by:

$$Vo/Va = \{Cs11/(S \cdot Cf2)\} \cdot fs \quad (45)$$

Even if the reference power source Vref connected to the second stationary contacts "b1" and "b2" of the switches S1 and S2 of the switched capacitor circuit 51 of the circuit shown in FIGS. 20A and 20B is replaced by the power source VSS for the contact "b1" and by a power source Vcc for the contact "b2", the mirror integrator functions in the same manner.

From the description of the switched capacitor circuits referring to FIGS. 19A and 19B and FIGS. 20A and 20B, it is seen that the switched capacitor circuits 72, 74 and 75 are respectively driven by the two power sources VDD and VSS. The band pass filter shown in FIGS. 18 which incorporates the switched capacitor circuits 72, 74 and 75 are driven only by the two power sources VDD and VSS, so that only two power source terminal are required. Thus, the three power source terminals which have been conventionally required may be reduced by one, so the circuit may be easily integrated.

Figure 21:
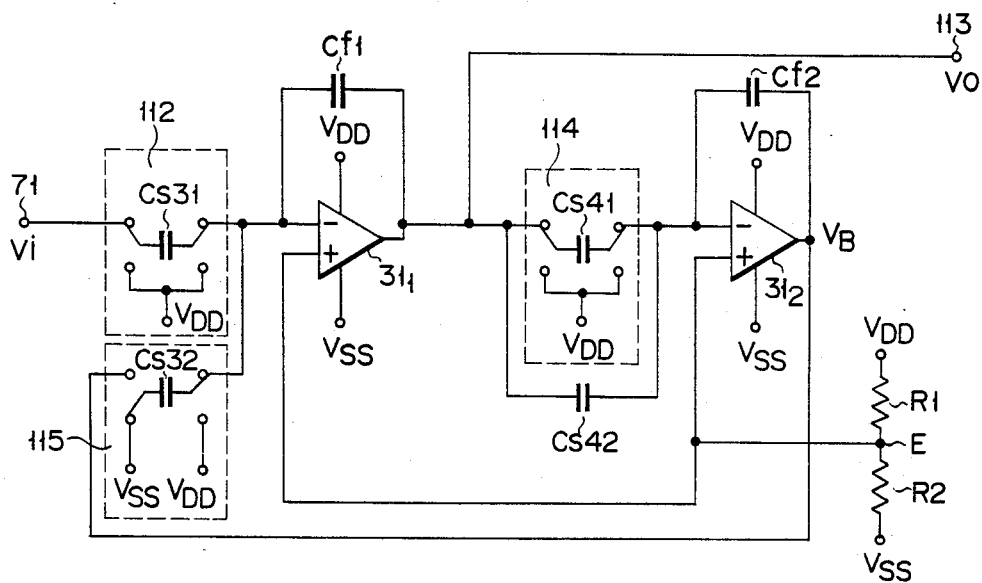
FIGS. 21, 22 and 23 are circuit diagrams of band pass filters according to still other embodiments of the present invention.

FIG. 21 shows a band pass filter according to another embodiment of the present invention. In this embodiment, the input capacitor Cs11 in the embodiment shown in FIG. 18 is replaced by a switched capacitor circuit 112 serving as a positive resistor. The input voltage signal Vi supplied to the input terminal 71 is supplied to the inverting input terminal (−) of the first operational amplifier $31_1$ through this switched capacitor circuit 112. A capacitor Cs42 is connected in parallel with a switched capacitor circuit 114 corresponding to the circuit 72 shown in FIG. 18. The switched capacitor circuit 74 for feedback to the non-inverting input terminal (+) of the second operational amplifier $31_2$ in the embodiment shown in FIG. 18 is omitted. The output signal Vo from the device is obtained from an output terminal 113 of the first operational amplifier $31_1$.

The rest of the circuit configuration remains the same as that of the embodiment shown in FIG. 18. Power sources VDD and VSS are connected as the drive sources to the first operational amplifier $31_1$. A feedback capacitor Cf1 is connected between the output terminal of the first operational amplifier $31_1$ and the inverting input terminal (−) thereof. The output terminal of the first operational amplifier $31_1$ is connected to the output terminal 113 of the device or the band pass filter as well as to the inverting input terminal (−) of the second operational amplifier $31_2$ through a switched capacitor circuit 114. The output terminal of the second operational amplifier $31_2$ is connected to its inverting input terminal (−) through the feedback capacitor Cf2. As in the case of the first operational amplifier $31_1$, two power sources VDD and VSS are connected as the drive sources to the second operational amplifier $31_2$. The output terminal of the second operational amplifier $31_2$ is connected to the inverting input terminal (−) of the first operational amplifier $31_1$ through a switched capacitor circuit 115 (corresponding to the circuit 75 shown in FIG. 18) for feedback. The non-inverting input terminals of the first and second operational amplifiers $31_1$ and $31_2$ are connected to the junction E of the bias circuit to receive the voltage VE at this junction.

In the circuit of this configuration, the input voltage signal Vi is the input voltage signal of the integrator consisting of the switched capacitor circuit 112, the feedback capacitor Cf1, and the first operational amplifier $31_1$. The first operational amplifier $31_1$ together with the switched capacitor circuit 115 and the feedback capacitor Cf1 constitutes an integrator which receives the output signal VB from the second operational amplifier $31_2$ as the input signal. Therefore, at the output terminal of the first operational amplifier $31_1$ is obtained the output voltage signal Vo which is the integrated value of the sum of the input voltage signal Vi and the output signal VB from the second operational amplifier $31_2$. The output voltage signal Vo from the first operational amplifier $31_1$ becomes an input voltage signal to the integrator consisting of the switched capacitor circuit 114, the feedback capacitor Cf2 and the second operational amplifier $31_2$, as well as an input voltage signal to the amplifying circuit consisting of the capacitor Cs42, the feedback capacitor Cf2 and the second operational amplifier $31_2$. Therefore, at the output terminal of the second operational amplifier $31_2$ is produced the output voltage signal VB which is the sum of the operation results of the integrator and the amplifying circuit. The output voltage signal Vo from the first operational amplifier $31_1$ and the output voltage signal VB from the second operational amplifier $31_2$ are respectively given by:

$$Vo = -\{Cs31/(S \cdot Cf3)\} \cdot fs \cdot Vi + \{Cs32/(S \cdot Cf3)\} \cdot fs \cdot VB \quad (46)$$

$$VB = -\{CS41/(S \cdot Cf4)\} \cdot fs \cdot Vo - (Cs42/Cf4) \cdot Vo \quad (47)$$

Substitution of equation (47) into equation (46) provides a transfer function H(s):

$$H(s) = Vo/Vi = \quad (48)$$

$$\frac{-\{S \cdot (CS31/Cf3) \cdot fs\}}{\{S^2 + S(Cs42/Cf4) \cdot (Cs32/Cf3) \cdot fs + (Cs41/Cf4) \cdot (Cs32/Cf3) \cdot fs^2\}}$$

From equations (48) and (13), we obtain:

$$(Vs31/Cf3) \cdot fs = \omega C \quad (49)$$

$$(Cs42/Cf4) \cdot (Cs32/Cf3) \cdot fs = \omega C/Q \quad (50)$$

$$(Cs41/Cf4) \cdot (Cs32/Cf3) \cdot fs^2 = \omega C^2 \quad (51)$$

Therefore, $$Cs31/Cf3 = Cs32/Cf3 = Cs41/Cf4 = \omega C^2 \quad (52)$$

$$Cs42/Cf4 = 1/Q \quad (53)$$

The integration constants of the respective integrators are equal to each other. The characteristic constant Q which determines the band pass characteristic is determined by the ratio Cs41/Cf2 alone, so that the band pass characteristic may be easily controlled. The fact that the integration constants of the first and second operational amplifiers $31_1$ and $31_2$ are equal to each other implies that the characteristics of these amplifiers $31_1$ and $31_2$ may be made equal to each other easily. For this reason, the band pass filter of the above embodiment having such amplifiers is suitable for forming into an integrated circuit.

If a band pass filter has first and second amplifiers $31_1$ and $31_2$ whose integration constants are not equal to each other, the dimensions of the respective transistors must be set to correspond to the integration constants of the respective amplifiers. This makes the design of the circuit complex and interferes with easy integration of the circuit. If, on the other hand, the integration constants of the amplifiers are equal to each other as in the case of this embodiment, the dimensions of the respective transistors may be set uniform, so that the circuit may be more readily integrated.

Figure 22:
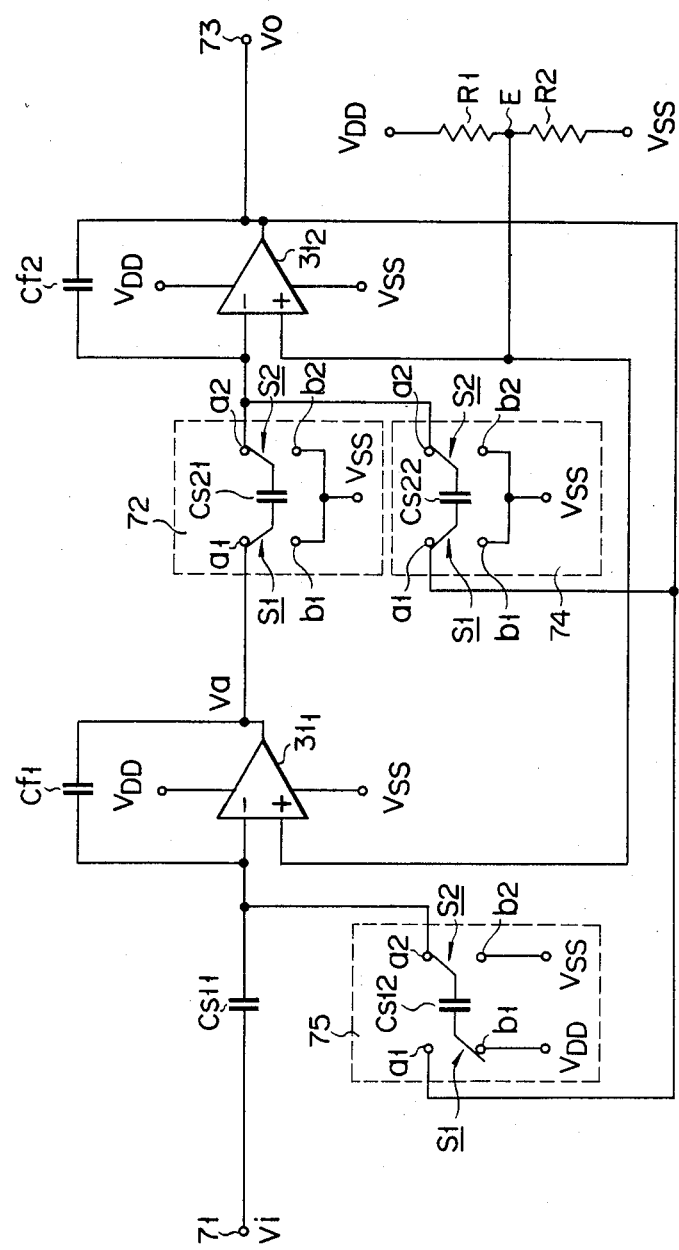

FIG. 22 shows still another embodiment of the present invention. In this embodiment, the power sources VDD and VSS for the switched capacitor circuits 72, 74 and 75 in the embodiment shown in FIG. 18 are replaced by each other.

Figure 23:
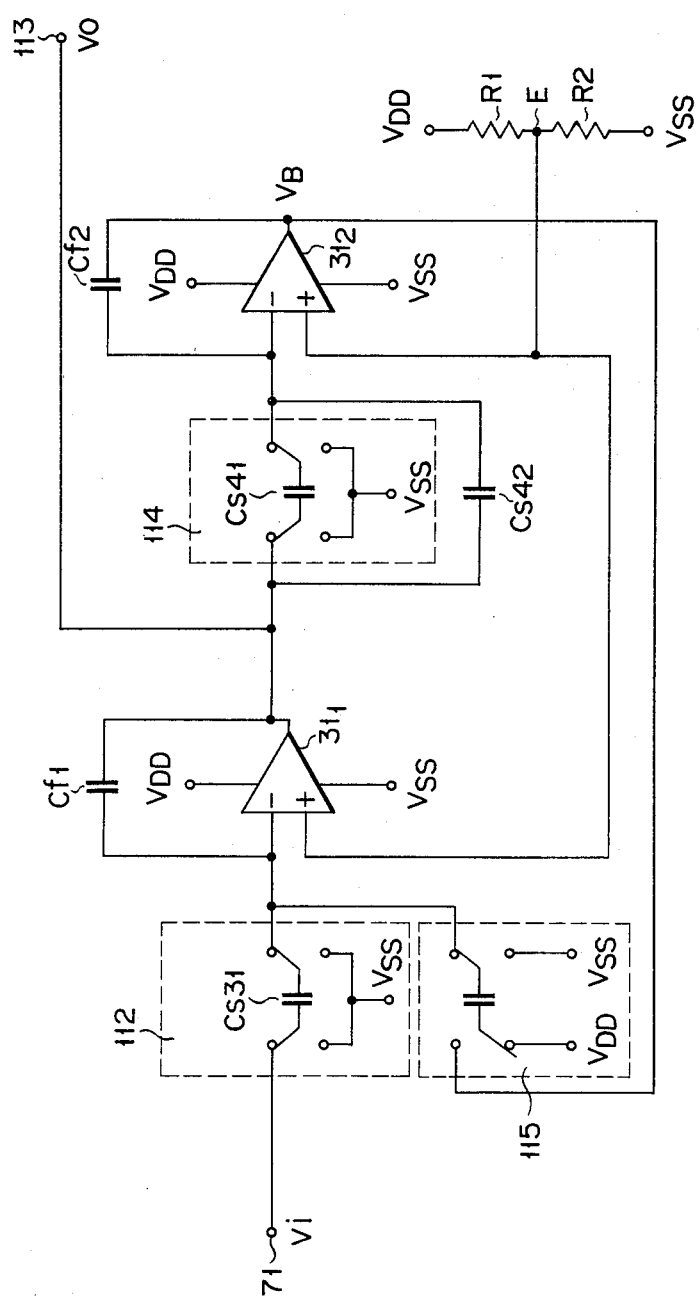

FIG. 23 shows still another embodiment of the present invention. In this embodiment, the power sources VDD and VSS for the switched capacitor circuits 112, 114 and 115 are replaced by each other.

In the embodiments shown in FIGS. 22 and 23, each switched capacitor circuit may be able to function equivalently as the resistor of the embodiment shown in FIG. 18 or 21. Therefore, the similar effects as in these embodiments may be obtained.

In the embodiments described above, the bias circuit for applying a voltage VE (e.g, (VDD−VSS)/2) to the non-inverting input terminals (+) of the first and second operational amplifiers $31_1$ and $31_2$ may be modified in various ways. The bias circuit consisting of resistors shown in FIGS. 13A and 13B may be used as the bias circuit in the other embodiments, or vice versa.

For example, a booster circuit which consumes less power may be used. If MOS transistors are used at the initial stages of the amplifiers $31_1$ and $31_2$, the input impedance at their non-inverting input terminals (+) becomes substantially infinite. Therefore, a bias circuit for producing a voltage VE of a high impedance may be used. Since such a bias circuit consumes only small power, the overall device may be easily integrated.

If the voltage VE output from the bias circuit in each embodiment described above is set to be ½(VDD−VSS), the voltage VE equals the reference potential Vref in the conventional switched capacitor circuits shown in FIGS. 5A and 5B and in FIGS. 6A and 6B and in the conventional filter shown in FIG. 7. Therefore, it may seem that the voltage VE from the bias circuit may be used as the reference potential Vref in the conventional switched capacitor circuits shown in FIGS. 5A and 5B and in FIGS. 6A and 6B and in the conventional filter shown in FIG. 7. However, this actually results in a problem. More specifically, the potential of the output voltage from the bias circuit has a higher impedance than the power sources. Therefore, if the voltage VE is used as the reference potential Vref, when both ends of the switched capacitor are connected for discharge, the potential of the output voltage from the bias circuit slightly fluctuates. This results in a change in the integration constant as well as in a change in the potential of the input voltage signal to the non-inverting input terminals (+) of the amplifiers. Then, the output potential of the amplifiers changes and the circuit operates erroneously. In view of this, in the embodiments of the present invention, the voltage VE output from the bias circuit is applied only to the non-inverting input terminals (+) of the amplifiers $31_1$ and $31_2$ and is not applied to the switched capacitor circuits.

In the band pass filter shown in FIGS. 18, 21, 22 and 23, the number of power sources required may be reduced as compared to the conventional filter, so that the number of power source terminals may be correspondingly reduced and the overall device may be easily integrated.

As may be seen from the above description, the switched capacitor device of the present invention uses a switched capacitor integrator wherein power sources for operational amplifiers are connected to the discharge path of the switched capacitor circuit, and these power sources constitute a bias circuit which applies a bias voltage to the non-inverting input terminals of the operational amplifiers. Therefore, the number of power sources and hence the number of the power source terminals required may be reduced. The device may thus be integrated easily without complex pattern design, increase in the chip area or the like.

Although the present invention has been described with reference to the several preferred embodiments thereof, the present invention is by no means limited to these particular embodiments and various other changes and modifications may be made within the spirit and scope of the present invention.

What we claim is:

1. A band pass filter comprising:
a signal input terminal to which an input voltage signal is applied;
a signal output terminal from which an output voltage signal is taken out;
first and second power source terminals for connection to first and second power sources, respectively;
first operational amplifier means connected to said first and second power source terminals to be driven by said first and second power sources;
a first feedback capacitor connected between an inverting input terminal of said first amplifier means and an output terminal of said first amplifier means;
an input capacitor connected between said signal input terminal and said inverting terminal of said first amplifier means;
second operational amplifier means connected to said first and second power source terminals to be driven by said first and second power sources, an output terminal of the second amplifier means being connected to said signal output terminal;
a second feedback capacitor connected between an inverting input terminal of said second amplifier means and an output terminal of said second amplifier means;

a first switched capacitor connected, in a first switched mode, between said output terminal of said first amplifier means and said inverting input terminal of said second amplifier means, and, in a second switched mode, short-circuited and connected to said first power source terminal;

feedback circuit means for feeding an output voltage signal of said second amplifier means back to said inverting input terminals of said first and second amplifier means; and bias means connected to said first and second power source terminals for applying a predetermined bias voltage to non-inverting input terminals of said first and second amplifier means.

2. A band pass filter according to claim 1, wherein said feedback circuit means comprises second and third switched capacitors, the second switched capacitor being connected, in said first switched mode, between said inverting input terminal of said first amplifier means and said second power source terminal and, in said second switched mode, being connected between said output terminal of said second amplifier means and said first power source terminal, and the third switched capacitor being connected, in said first switched mode, between said output terminal of said second amplifier means and said inverting input terminal of said second amplifier means and, in said second switched mode, being short-circuited and connected to said first power source terminal.

3. A band pass filter according to claim 1, wherein said bias means comprises first and second resistor elements serially connected between said first and second power source terminals, the junction of said first and second resistor elements being at said predetermined bias voltage and being connected to said non-inverting input terminals of said first and second operational amplifier means.

4. A band pass filter comprising:

a signal input terminal to which an input voltage signal is applied;

a signal output terminal from which an output voltage signal is taken out;

first and second power source terminals for connection to first and second power sources, respectively;

first operational amplifier means connected to said first and second power source terminals to be driven by said first and second power sources;

a first feedback capacitor connected between an inverting input terminal of said first amplifier means and an output terminal of said first amplifier means;

a first switched capacitor connected, in a first switched mode, between said signal input terminal and said inverting input terminal of said first amplifier means and, in a second switched mode, short-circuited and connected to said first power source terminal;

second operational amplifier means connected to said first and second power source terminals to be driven by said first and second power sources;

a second feedback capacitor connected between an inverting input terminal of said second amplifier means and an output terminal of said second amplifier means;

a second switched capacitor connected, in said first switched mode, between said output terminal of said first amplifier means and said inverting input terminal of said second amplifier means and, in said second switched mode, short-circuited and connected to said first power source terminal;

a capacitor connected between said output terminal of said first amplifier means and said inverting input terminal of said second amplifier means;

feedback circuit means for feeding an output voltage signal of said second amplifier means back to said inverting input terminal of said first amplifier means; and bias means connected to said first and second power source terminals for applying a predetermined bias voltage to non inverting input terminals of said first and second amplifier means.

5. A band pass filter according to claim 4, wherein said feedback circuit means comprises a third switched capacitor connected, in said first switched mode, between said inverting input terminal of said first amplifier means and said second power source terminal and, in said second switched mode, connected between said output terminal of said second amplifier means and said first power source terminal.

6. A band pass filter according to claim 4, wherein said bias means comprises first and second resistor elements serially connected between said first and second power source terminals, the junction of said first and second resistor elements being at said predetermined bias voltage and being connected to said noninverting input terminals of said first and second operational amplifier means.

* * * * *

UNITED STATES PATENT AND TRADEMARK OFFICE
CERTIFICATE OF CORRECTION

PATENT NO. : 4,520,283

DATED : May 28, 1985

INVENTOR(S) : Sasaki et al.

It is certified that error appears in the above-identified patent and that said Letters Patent is hereby corrected as shown below:

Title Page, please add:

--Assignee: Tokyo Shibaura Denki Kabushiki Kaisha.--

Signed and Sealed this

Twenty-ninth Day of November, 1988

*Attest:*

DONALD J. QUIGG

*Attesting Officer*     *Commissioner of Patents and Trademarks*